United States Patent [19]

Komori et al.

[11] Patent Number: 4,653,026

[45] Date of Patent: Mar. 24, 1987

[54] NONVOLATILE MEMORY DEVICE OR A SINGLE CRYSTAL SILICON FILM

[75] Inventors: Kazuhiro Komori, Kodaira; Satoshi Meguro; Satoru Ito, both of Tokyo; Toshimasa Kihara, Tachikawa; Harumi Wakimoto, Hino, all of Japan

[73] Assignee: Hitachi, Ltd., Tokyo, Japan

[21] Appl. No.: 403,016

[22] Filed: Jul. 29, 1982

[30] Foreign Application Priority Data

Aug. 12, 1981 [JP] Japan .................................. 56-125189
Aug. 12, 1981 [JP] Japan .................................. 56-125204

[51] Int. Cl.$^4$ ............................................. G11C 11/40
[52] U.S. Cl. ..................................... 365/189; 365/230
[58] Field of Search ................ 365/189, 190, 230, 154

[56] References Cited

U.S. PATENT DOCUMENTS 4,139,785  2/1979  McElroy .............................. 365/178

Primary Examiner—Terrell W. Fears
Attorney, Agent, or Firm—Antonelli, Terry & Wands

[57] ABSTRACT

A nonvolatile memory device comprising a plurality of memory cells composed of insulated gate-type field effect semiconductor elements, terminals for applying a writing voltage and a reading voltage to said plurality of memory cells, wirings for connecting in common insulated gate-type field effect transistor elements of said plurality of memory cells, and resistance elements or MISFET's which are connected between the wirings and the terminals, wherein said resistance elements or MISFET's are composed of a polycrystalline silicon film or a single crystal silicon film formed on the field insulation film.

36 Claims, 33 Drawing Figures

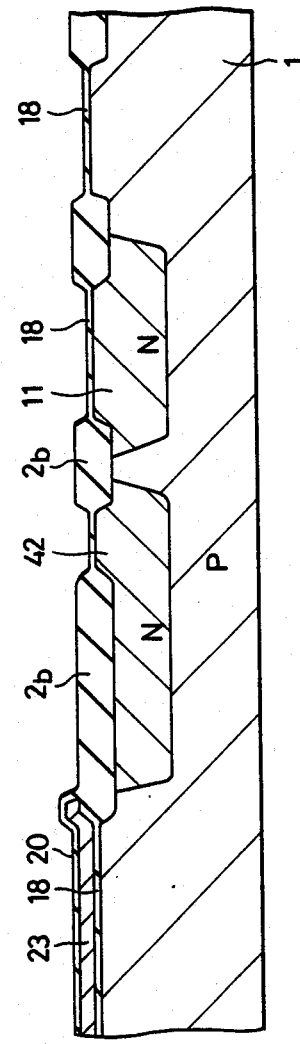
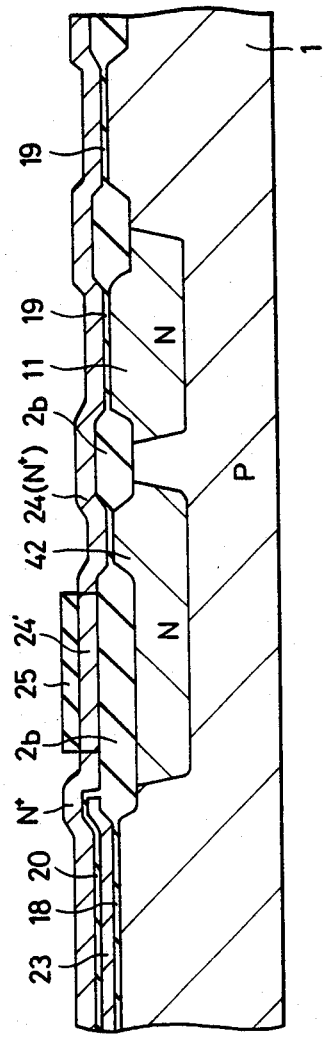
FIG. 9A
FIG. 9B

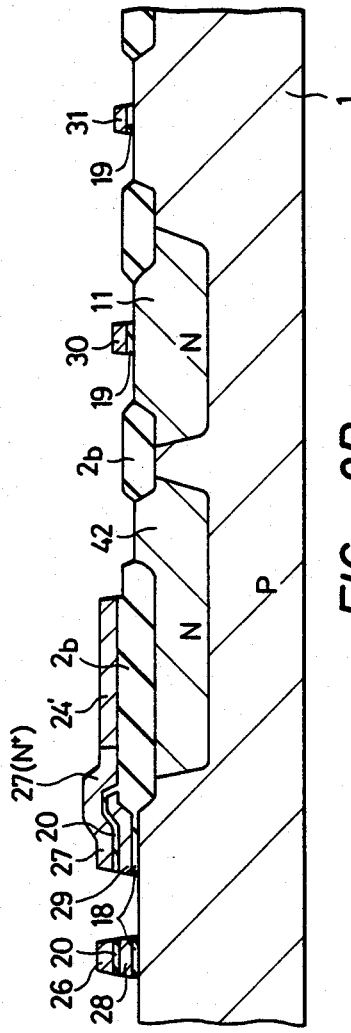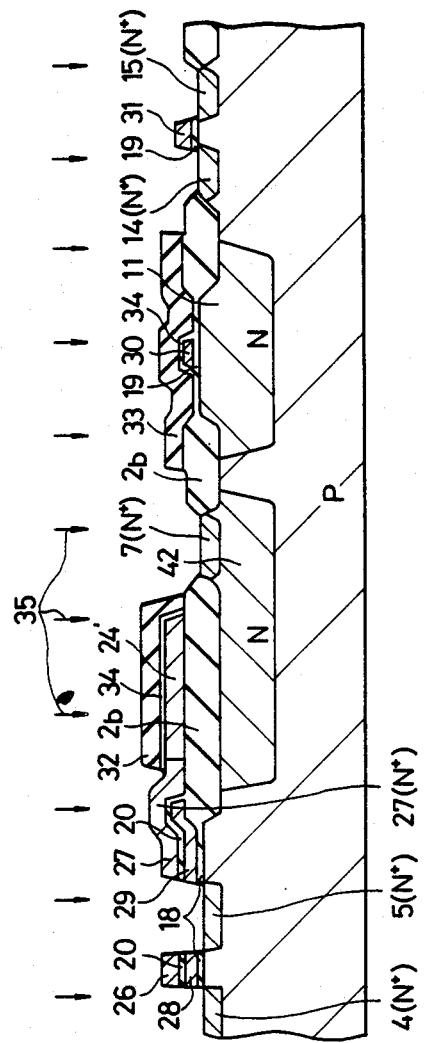

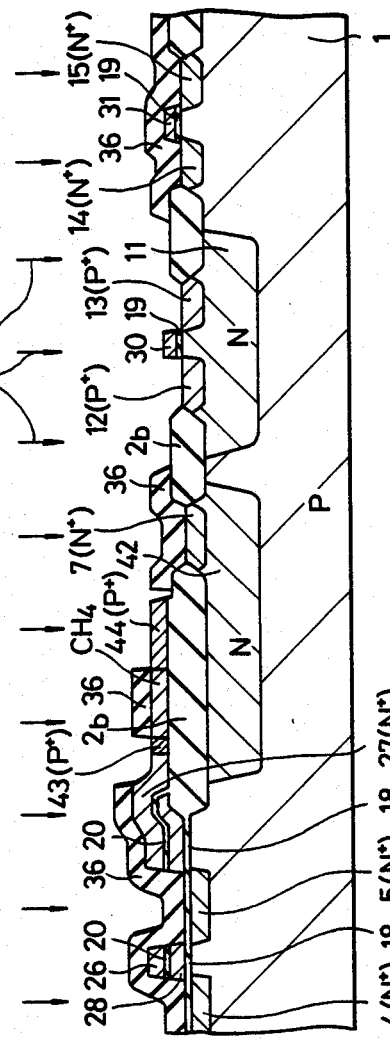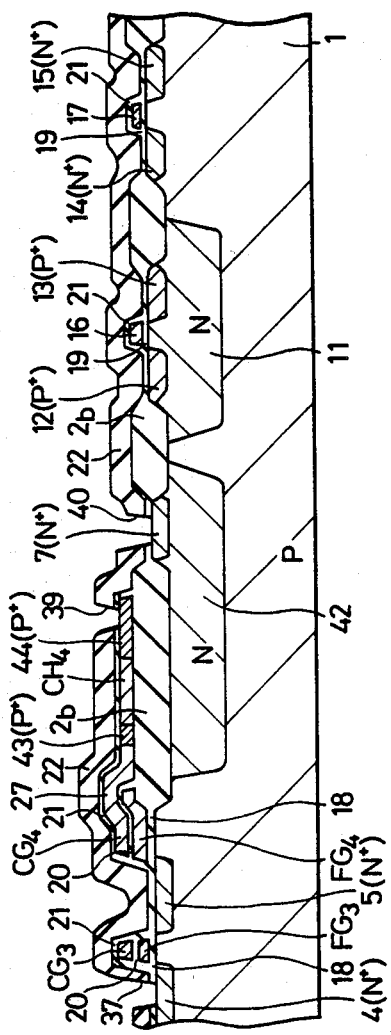

NONVOLATILE MEMORY DEVICE OR A SINGLE CRYSTAL SILICON FILM

BACKGROUND OF THE INVENTION

The present invention relates to a nonvolatile memory device such as an EPROM (erasable and electrically programmable ROM).

In a typical EPROM, memory cells made up of double gate construction MISFET's (metal insulated semiconductor field effect transistors) having a floating gate and a control gate are arrayed in the vertical and lateral directions. Control signals based on address signals to the X decoders are selectively applied to the control gates of the memory cells in the X direction through a common word line, and control signals based on address signals to the Y decoders are selectively applied to the drains of the memory cells in the Y direction through a common bit line, to thereby perform the writing and reading operations. In the thus constructed EPROM, a large amount of electric power is consumed if peripheral circuits such as decoders are constituted by MISFET's having channels of the same conductivity type. The inventors of the present invention therefore have attempted to reduce the power consumption by constructing the peripheral circuits using CMOS (complementary metal oxide semiconductor) FET's.

Through their study, however, the inventors of the present invention have found that if the peripheral circuits are made up of CMOSFET's, an N-channel MISFET of the depletion mode which is used as a resistance element in a pull-up circuit which is connected between the word line and the power supply terminal $V_{PP}$ for charging the word line, permits a large amount of current to flow from the word line into the X decoder particularly when the data is to be read, and makes it difficult to achieve the object of reducing the power consumption. More specifically, a transfer gate (MISFET of the depletion mode) connected between the X decoder and the word line on a non-selected line is rendered conductive when the data is to be read. Therefore, a potential difference equal to the reading voltage ($V_{PP}=5$ volts) appears across the resistor. However, since the MISFET in the pull-up circuit has a small resistance, the electric current easily flows from the power supply terminal $V_{PP}$ to the X decoder via the MISFET, word line and transfer gate. The current flowing through each word line amounts to about 10 $\mu A$. Therefore, in a typical EPROM of this structure the total current can easily amount to about 5 mA. The same phenomenon also appears when the MISFET of the depletion mode is used as a resistance element in the pull-up circuit on the side of the Y decoders. Namely, extra current flows into the Y decoder when the data is to be read, resulting in the increase in the consumption of electric current (electric power).

To reduce the consumption of current when the data is to be read, and to reduce the consumption of electric power by the EPROM, it can be attempted to reduce the ratio (W/L) of channel width of the MISFET to the channel length, such that the drain current is reduced. In this case, however, the only method is to increase the channel length since the channel width cannot be so reduced. Increase of the channel length, however, results in the increase of the area of MISFET and makes it difficult to integrate the device highly densely.

The inventors of the present invention therefore have studied the use of a P-channel MISFET of the enhancement mode as a resistance element instead of the N-channel MISFET of the depletion mode. In this case, the current could be prevented from flowing into the non-selected lines when the data was being read. However, use of a writing voltage $V_{PP}$ of as great as 25 volts or 21 volts during the writing operation invited the occurrence of latch-up phenomenon causing the elements to be damaged. That is, parasitic transistors of the PNP- and NPN-type are formed by the diffusion regions, semiconductor substrates and wells of the N-channel MISFET and P-channel MISFET, and a PNPN thyristor structure is rendered conductive (occurrence of latch-up phenomenon) by the parasitic transistors being triggered by a high voltage applied to the parasitic transistors.

SUMMARY OF THE INVENTION

The first object of the present invention is to provide a memory device with greatly reduced electric power consumption, which enables the degree of integration to be increased, which prevents the occurrence of latch-up phenomenon, and which operates stably. A second object of the present invention is to provide such a memory device with greatly reduced electric power consumption, which enables the degree of integration to be increased, prevents the occurrence of the latch-up phenomenon, and operates stably, wherein a resistance element used in the pull-up circuit exhibits a large resistance when data is to be read in order to restrain the reactive current, and exhibits a small resistance when data is to be written in order to increase the charging speed.

BRIEF DESCRIPTION OF THE DRAWINGS

FIGS. 9A to 9F are section views illustrating the steps for producing the memory cell portion A and the peripheral circuit element portion B of FIG. 8;

FIGS. 16 to 19 illustrate a ninth embodiment of the present invention, wherein FIGS. 16 and 19 are plan views of pull-up resistors, FIG. 17 is a section view showing memory cell portion A and peripheral circuit element portion B, and FIG. 18 is a graph showing the relation between the gate voltage and the drain current;

FIG. 22 is a plan view showing a memory cell portion, and FIG. 23 is a section view showing the memory cell portion A and the peripheral circuit element portion B.

DESCRIPTION OF THE PREFERRED EMBODIMENTS

Embodiments of the present invention adapted to EPROMs will now be described in conjunction with the drawings.

Figure 1:
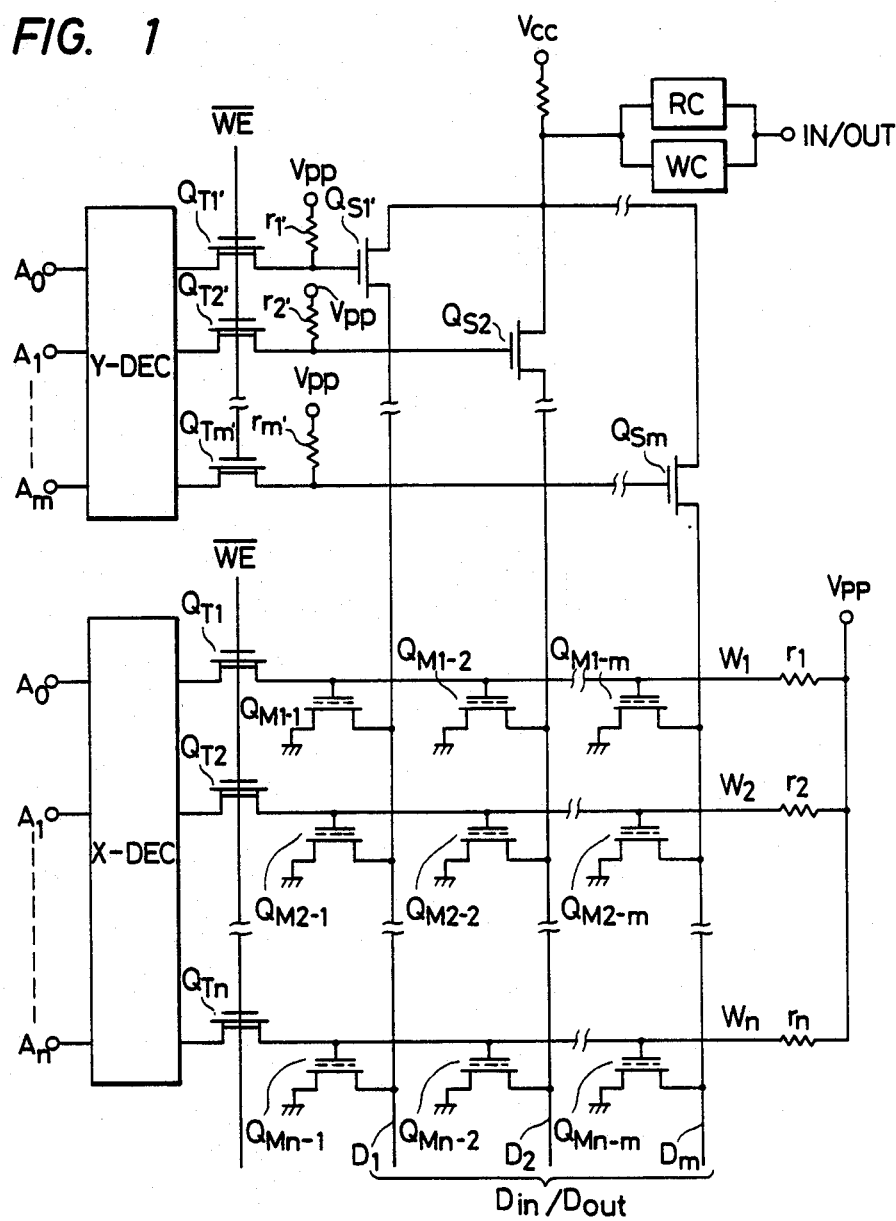
FIG. 1 is a diagram of an equivalent circuit of an EPROM according to a first embodiment of the present invention.

FIG. 1 shows the circuit setup of an EPROM according to a first embodiment of the present invention. The memory cells are arrayed in the vertical and lateral directions, being made up of double gate construction N-channel MISFET's ($Q_{M1-1}, -Q_{M1-m}$) to ($Q_{Mn-1}' - Q_{Mn-m}$) having a floating gate and a control gate. Common word lines $W_1$, $W_2, -W_n$ connecting the control gates, and common bit lines $D_1$, $-D_m$ connecting the drains, are arrayed in a crossing manner in the form of a matrix. The ends on one side of the word lines are connected to an X decoder X-DEC via depletion mode transfer gates $Q_{T1}, -Q_{Tn}$, and the other ends are connected to a power supply terminal $V_{PP}$ via high-resistance elements $r_1, -r_n$ which constitute pull-up circuits for charging the word lines. The individual bit lines are connected to a reading circuit RC and to a writing circuit WC through a common bit line via switching MISFETs $Q_{S1}, -Q_{Sm}$. Further, gates of the FET's $Q_{S1}, -Q_{Sm}$ are connected to a Y decoder Y-DEC via transfer gates $Q_{T1}', -Q_{Tm}'$. Further, high-resistance elements $r_1', -r_m'$ of the pull-up circuits are connected between the power-supply terminal $V_{PP}$ and the points where FET's $Q_{S1}, -Q_{Sm}$ and transfer gates $Q_{T1}', -Q_{Tm}'$ are connected together.

In order to reduce the consumption of electric power in this EPROM, the peripheral circuits such as decoders X-DEC and Y-DEC as well as the reading and writing circuits are all constructed using CMOS transistors. Here, attention should be given to the fact that high-resistance polycrystalline silicon films have been used, instead of the above-mentioned depletion mode MISFET's, as the resistance elements $r_1, -r_n$, $r_1', -r_m'$ in the pull-up circuits on the side of the power supply terminal $V_{PP}$ to apply a high voltage.

The operation of the EPROM will now be described. When data is to be written, a high voltage (for example, 25 volts) is applied to the power supply terminal $V_{PP}$. When data is to be read, a low voltage (for example, 5 volts) is applied. On the other hand, the voltage produced on the word lines connected to the output side of the X decoder X-DEC is set to a high level of, for example, 5 volts when the lines are selected, and is set to a low level of, for example, 0 volt when the lines are not selected.

The write enable voltage $\overline{WE}$ applied to gates of the depletion-type transfer gates consisting of MISFET's $Q_{T1}, -Q_{Tn}$ is set to the high level of, for example, 5 volts when data is to be read, and is set to the low level of, for example, 0 volt when data is to be written.

The writing operation will now be described. When word line $W_1$ is selected with a high voltage of, for example, 25 volts being supplied to the power supply terminal $V_{PP}$, the transfer gate consisting of MISFET $Q_{T1}$ is rendered non-conductive. Therefore, the high voltage (25 volts) is applied to the word line $W_1$. In this case, if the switching MISFET $Q_{S1}$ has been selected by the Y decoder Y-DEC, a voltage of 12 volts is applied to the drain of the memory cell $Q_{M1-1}$ from the writing circuit WC. Here, the data is written on the memory cell $Q_{M1-1}$. Here, the transfer gates consisting of MISFET's $Q_{T2}, -Q_{Tn}$ are rendered conductive, and the not-selected word lines $W_2, -W_n$ assume the reference level (ground level). No voltage is applied to control gates of the memory cells connected to the not-selected word lines.

The reading operation will now be described. A low voltage such as 5 volts is applied to the power supply terminal $V_{PP}$. The output of the selected X decoder is set to 5 volts. When the word line $W_1$ is selected, the source voltage of the MISFET $Q_{T1}$ assumes 5 volts and, hence, the transfer gate $Q_{T1}$ is rendered conductive. Consequently, the voltage (5 volts) of the X decoder is supplied to the word line $W_1$.

When the switching MISFET $Q_{S1}$ is selected by the Y decoder, on the other hand, a voltage of 5 volts is applied to the drain of the memory cell $Q_{M1-1}$ through the reading circuit. The reading operation is thus carried out.

When data is being read, the not-selected word lines $W_2, -W_n$ assume the reference level (ground level). In this case, a leakage current flows from the power supply terminal $V_{PP}$ to the not-selected word lines $W_2, -W_n$ via the pull-up resistors $r_2, -r_n$. The resistors $r_2, -r_n$ must therefore have a high resistance. The present invention is to provide resistor elements which satisfy this requirement.

The construction of the EPROM having such resistance elements will now be described in detail with reference to FIGS. 2 and 3.

Figure 2:
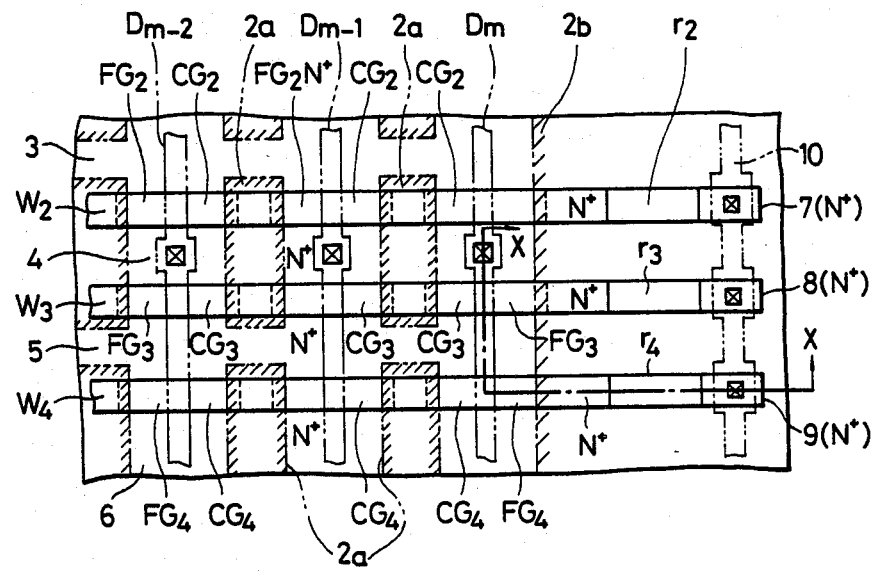
FIG. 2 is a plan view showing a portion of the memory cells and pull-up circuit in the EPROM of FIG. 1.
Figure 3:
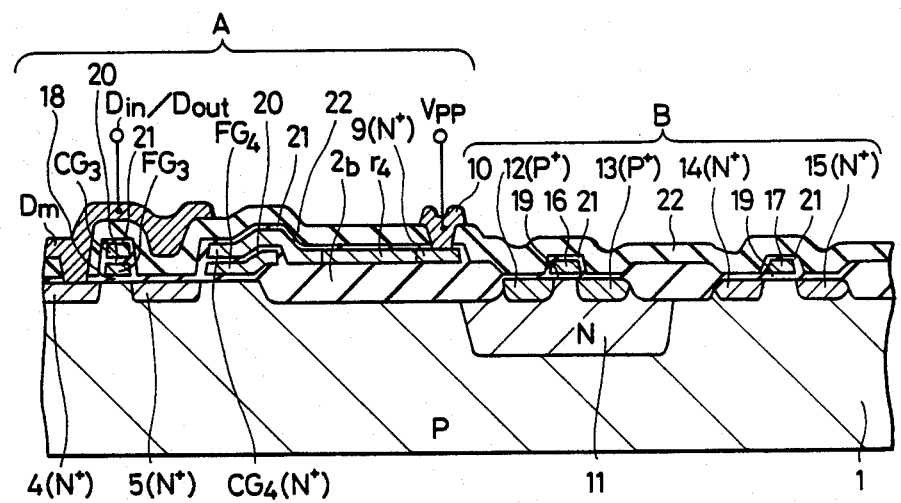
FIG. 3 is a section view of which portion A illustrates a part along the line X—X of FIG. 2, of which portion B illustrates a part of peripheral circuit elements.

FIG. 2 shows pull-up circuits for the three word lines $W_2$, $W_3$ and $W_4$ of FIG. 1, and FIG. 3 is a section view of which portion A illustrates a part along the line X—X of FIG. 2 of which portion B illustrates a part of peripheral circuit elements. Pull-up circuits for the other word lines and resistors $r_1', -r_m'$ are constructed in the same manner as in FIGS. 2 and 3, and are not shown in the diagram. The memory cells are divided by field SiO$_2$ films $2a$ formed on one main surface of a P-type silicon substrate 1. Further, the memory cell portion A is separated from the peripheral circuit element portion B for decoders etc. by a field SiO$_2$ film $2b$. The channel stopper under the field SiO$_2$ films has been omitted to simplify the diagram. The memory cells consist of N+-type diffusion regions 3, 4, 5 and 6 formed in the substrate 1, control gates CG$_2$, CG$_3$ and CG$_4$ formed as portions of word lines composed of polycrystalline silicon films, and floating gates FG$_2$, FG$_3$ and FG$_4$ composed of polycrystalline silicon films under the control gates. The control gates stretch as word lines onto the field SiO$_2$ film $2b$, and their portions which are not treated with phosphorus or not injected with ions serve as high-resistance elements r$_2$, r$_3$ and r$_4$ in the pull-up circuits. The high-resistance elements $r_2, r_3, r_4$ are therefore composed of the same second layer polycrystalline silicon films as the word lines (and control gates), and N+-type polycrystalline silicon films 7, 8, 9 at their ends are connected to a common aluminum wiring 10 which is connected to the power supply terminal $V_{PP}$.

The resistor elements $r_1, r_2, -r_n$ should have an electric resistance of greater than $10^6$ ohms, preferably $10^7$ to $10^{10}$ ohms, and more preferably $10^8$ to $10^9$ ohms. The resistance must be far greater than the resistance ($5 \times 10^5$ ohms) of depletion mode N-channel MISFET's. That is, as mentioned with reference to the circuit of FIG. 1, when, for example, transistor $Q_{M2-1}$ of the nonselected line is rendered conductive when data is to be read, the polycrystalline silicon resistor $r_2$ having a high resistance will permit only a very small current to flow into the decoder X-DEC via word line $W_2$ and transistor $Q_{M2-1}$. On the side of the Y decoder Y-DEC, the resistors $r_1', -r_m'$ have resistances as great as $10^7$ to $10^{10}$ ohms, so only a very small current can flow into the decoder Y-DEC. Consequently, the current flowing into the decoders when data is to be read can be greatly reduced as a whole, or made smaller than several nanoamperes per element, making it possible to reduce the electric power consumption to a degree comparable with that of CMOS. In this sense, the resistors $r_1, -r_n$, $r_1', -r_m'$ should have a resistance greater than $10^7$ ohms. The resistance, however, should not be greater than $10^{10}$ ohms, since too great a resistance decreases the writing speed. In the embodiment, peripheral circuits such as decoders are composed of CMOS, as shown in FIG. 3, to reduce the electric power consumption. In FIG. 3, reference numeral 11 denotes an N-type well, 12 and 13 denote P+-type diffusion regions, 14 and 15 denote N+-type diffusion regions, 16 and 17 denote gate electrodes composed of second layer polycrystalline silicon, 18 and 19 denote gate oxide films, 20 and 21 denote $SiO_2$ films on the surfaces of the polycrystalline silicon films, and 22 denotes a film of phosphorus silicate glass.

As described above, the high-resistance elements $r_1-r_n, r_1'-r_m'$ in the pull-up circuits of this embodiment are radically different from the aforementioned depletion mode N-channel MISFET's. That is, the size of the elements does not need to be increased to reduce the current when data is to be read. Rather, the size (particularly, the width and thickness of the resistor films) may be slightly changed or impurities may be introduced by ion injection to obtain a desired high resistance. Therefore, the size of the resistance elements can be reduced to smaller than one-tenth the size of the MISFET, making it possible to densely integrate the EPROM itself.

Further, the high-resistance elements $r_1-r_n, r_1'-r_m'$ have all been formed on the field $SiO_2$ film 2b, and are separated from the substrate 1, so parasitic transistors relative to the elements in the CMOS portion B of FIG. 3 are not formed, i.e. the latch-up phenomenon can be effectively prevented, and the operation is stable. Even if it is attempted to use resistors composed of diffusion regions or ion-injected regions formed in the substrate 1, instead of the above-mentioned high-resistance elements, it is at present difficult to impart sufficiently great resistance to such regions. In the case of the N-type resistance regions, furthermore, a thyristor construction develops relative to the side of the CMOS portion, causing the latch-up phenomenon.

The high-resistance elements consist of the second layer polycrystalline silicon film, and can be easily formed with precision without any need to change the process for producing ordinary EPROM's. This is described below along the manufacturing process of FIG. 4.

Figure 4A:
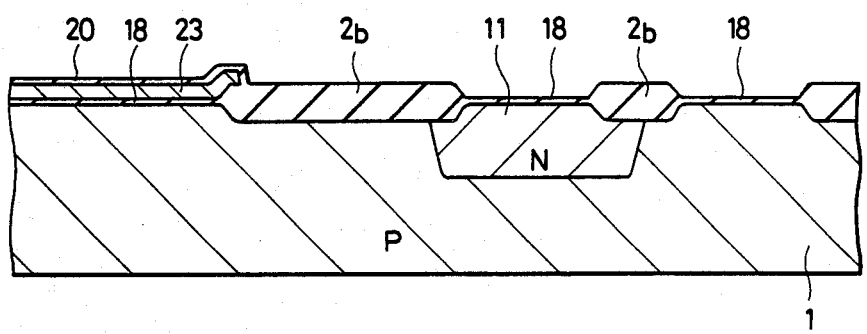
FIGS. 4A to 4F are section views illustrating the steps for producing the memory cell portion A and the peripheral circuit element portion B of FIG. 3.

First, as shown in FIG. 4A, an N-type well 11 and a field $SiO_2$ film 2b are selectively formed on one main surface of the P-type silicon substrate 1 by diffusion and selective oxidation techniques. After a gate oxide film 18 is formed, a polycrystalline silicon film is grown on the entire surface of the silicon substrate 1 by chemical vapor deposition (hereinafter referred to as CVD), and is patterned by photoetching to form a polycrystalline silicon film 23 of a predetermined shape after it has been treated with phosphorus (i.e. after the polycrystalline silicon film is dopted with impurities). The surface of the polycrystalline silicon film 23 is then oxidized to form a thin $SiO_2$ film 20 thereon. The gate oxide film on the side of peripheral circuits is removed and a new gate oxide film 19 is formed, or the gate oxide film 18 may be utilized as the gate oxide film 19.

Figure 4B:
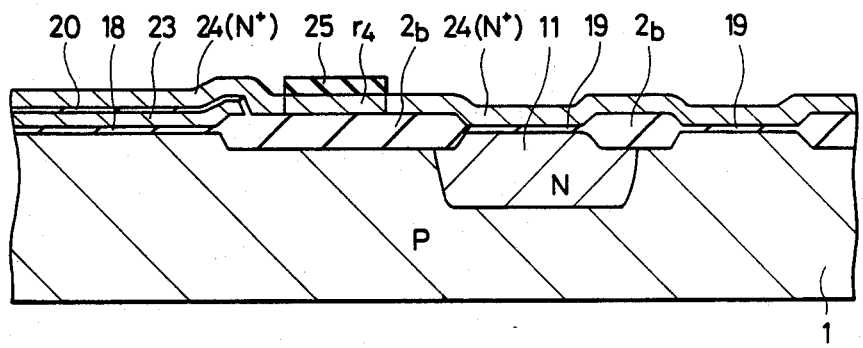

Then, the second layer polycrystalline silicon film 24 is deposited on the entire surface of the substrate 1 by CVD as shown in FIG. 4B, and a predetermined portion thereof is covered with an $SiO_2$ film 25 (mask) by CVD, followed by treatment with phosphorus. The polycrystalline silicon film 24 not covered with the mask 25 becomes N+-type, and the polycrystalline silicon film beneath the mask 25 remains a high-resistance polycrystalline silicon film.

Figure 4C:
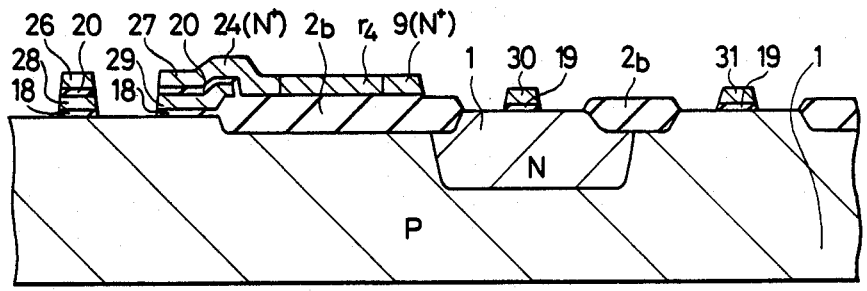

The mask 25 is then removed by etching as shown in FIG. 4C, and the polycrystalline silicon film 24, $SiO_2$ silm 20, polycrystalline silicon film 23, and $SiO_2$ film 18 are successively subjected to the etching of the same pattern. Thus, polycrystalline silicon films 26 and 27 in the form of control gates, polycrystalline silicon films 28 and 29 in the form of floating gates, and polycrystalline silicon films 30 and 31 in the form of gate electrodes of peripheral circuits, are formed, and the gate oxide film on both sides of the polycrystalline silicon film are removed to expose the substrate. Through the above-mentioned patterning, an N+-type polycrystalline silicon film 9 of a predetermined pattern remains on one side of the resistor element $r_4$.

Figure 4D:
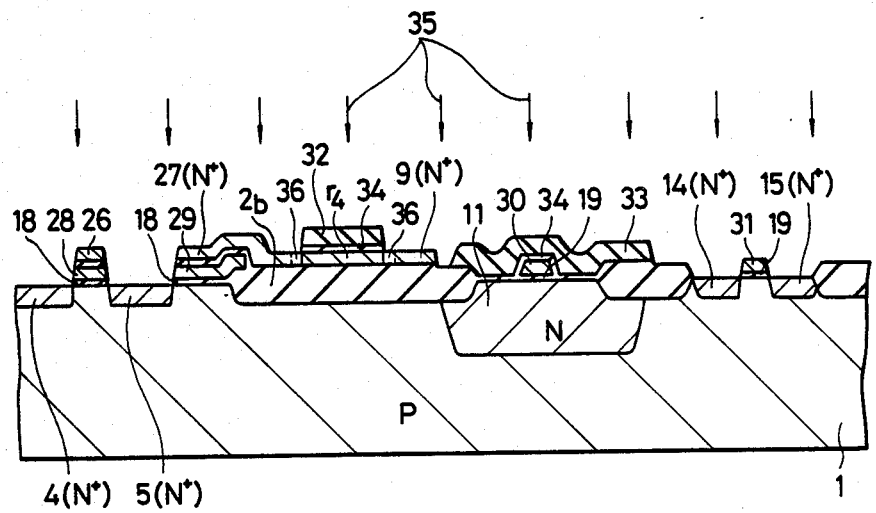

Thereafter, the surface of the substrate is slightly oxidized by heating to form a thin $SiO_2$ film 34 as shown in FIG. 4D, and a $SiO_2$ film is then formed on the entire surface of the substrate 1 by CVD. The $SiO_2$ silm is subjected to selective etching to form masks 32, 33 that cover the resistor $r_4$ and the well 11. Through the etching for forming the masks 32, 33, the thin $SiO_2$ film 34 is removed except for the portions under the masks 32, 33. The surface of the substrate 1 and the surfaces of the polycrystalline silicon films 26, 27, 30, 31 and 9, are then irradiated with a beam 35 of arsenic ions to selectively inject arsenic ions into the exposed surface of the substrate and into the polycrystalline silicon films 27, 9 that are not covered with the masks 32, 33, and it is then annealed in nitrogen. Thus, N+-type diffusion regions 4, 5, 14 and 15 are formed as source regions or drain regions in the substrate 1, and an N+-type silicon 36 is formed to be contiguous with the polycrystalline silicon films 27, 9. The size of the N+-type silicon film 36 can be arbitrarily set depending upon the shape of the mask 32 and, hence, the resistance of the high-resistance polycrystalline silicon resistor $r_4$ can be set to any desired value. In FIG. 3 and in the subsequent drawings, the N+-type polycrystalline silicon film 36 on both sides of the high-resistance resistor $r_4$ is shown formed as a unitary structure with the N+-type polycrystalline silicon films 27 and 9.

Figure 4E:
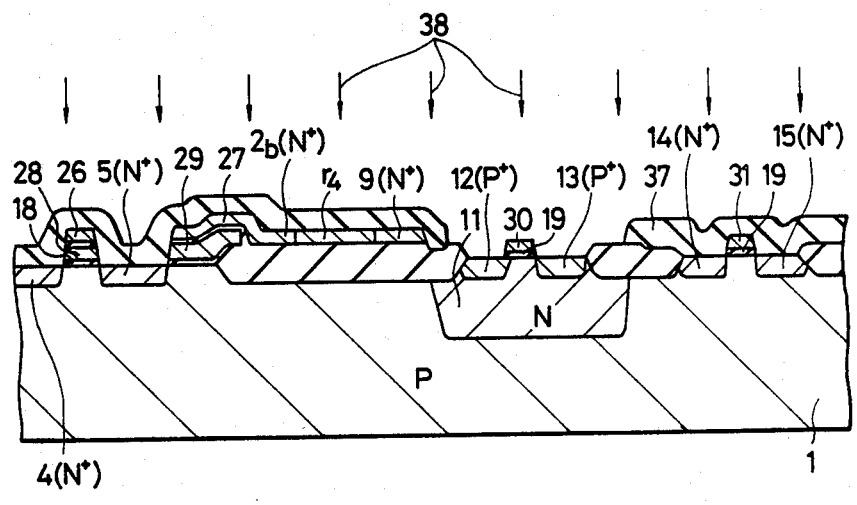

The masks 32, 33 are then removed as shown in FIG. 4E, and a new SiO$_2$ film is deposited by CVD followed by etching to form SiO$_2$ films 36, 37 on predetermined portions. Using the SiO$_2$ films 36, 37 as masks, the entire surfaces are irradiated with a beam 38 of boron ions to form P+-type diffusion regions 12, 13 that serve as source or drain regions in the well 11.

Figure 4F:
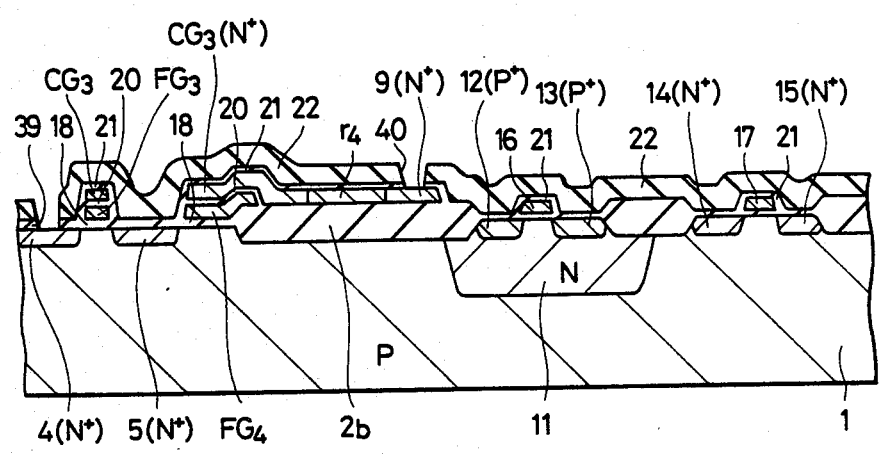

Referring to FIG. 4F, the masks 36, 37 are removed, and the surfaces are lightly treated with heat in an oxidizing atmosphere to form an SiO$_2$ film, thereby to form gate electrodes CG$_3$, CG$_4$, FG$_3$, FG$_4$, 16 and 17 of the MISFET's. Then, phosphorus silicate glass film 22 deposited on the whole surfaces by CVD and the underlying SiO$_2$ film are selectively removed by photoetching to form through holes 39, 40 contacts.

Aluminum is then deposited on the entire surface by vacuum deposition techniques, and subjected to patterning through photoetching to form aluminum wirings such as bit line $D_m$, power supply line 10, and the like as shown in FIG. 3.

Figure 5:
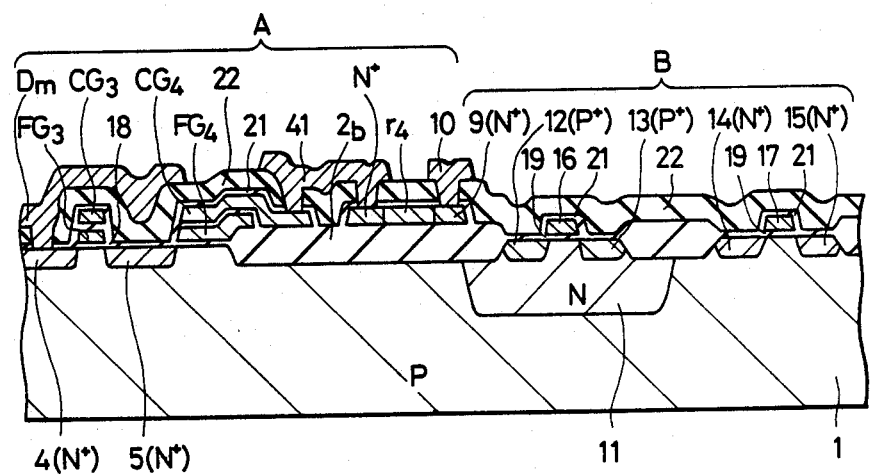
FIG. 5 is a section view showing a second embodiment of the present invention.

FIG. 5 shows the construction according to a second embodiment of the present invention.

FIG. 5 corresponds to the section view of FIG. 3, but is different that the high-resistance element $r_4$ in the pull-up circuit is composed of polycrystalline silicon of the first layer, and is connected to the control gate CG$_4$ through an aluminum wiring 41. With this construction, a high-resistance element which exhibits the same functions and effects as those of the above-mentioned embodiment can be obtained without any need of changing the manufacturing processes.

The manufacturing process is as follows. The polycrystalline silicon film of the first layer is left on the field SiO$_2$ film 2b in the step of FIG. 4A, and the surfaces are selectively treated with phosphorus in the same manner as the step of FIG. 4B to form a high-resistance polycrystalline silicon portion. After the surface of the polycrystalline silicon film of the first layer is oxidized, the second polycrystalline silicon layer is applied thereon and subjected to the patterning as shown in FIG. 4C, followed by oxidation. In this case, the polycrystalline silicon film of control gate CG$_4$ is subjected to such a patterning that it is separated from the polycrystalline silicon film which forms the resistor $r_4$ as shown in FIG. 5. Arsenic ions are then injected as shown in FIG. 4D with the SiO$_2$ film formed by CVD as a mask to thereby form N+-type regions. In this case, the high-resistance portion $r_4$ should be covered with a mask (SiO$_2$). Then, like the step of FIG. 4E, boron ions are injected and the surfaces are oxidized, followed by the formation of phosphorus silicate glass film just like the step of FIG. 4F. After holes through the glass film are formed, aluminum is evapor-deposited, and aluminum wirings $D_m$, 41, and 10 are formed by patterning.

First and second embodiments of the present invention have been described above. The above embodiments, however, can be further modified based on the technical idea of the present invention. For example, in addition to using a high-resistance polycrystalline silicon film, it is also possible to use a PN junction diode formed in the polycrystalline silicon film as a high-resistance element in the pull-up circuit. Moreover, the polycrystalline silicon film may be converted into a single crystal film by the conventional annealing method with a laser beam, to use the single crystal silicon film as a high-resistance element. The invention can be adapted not only to the above-mentioned EPROM, but also to EAROM (electrically alterable ROM), as well as to any other non-volatile memory used under the conditions of high voltages $V_{PP}$.

An EPROM according to a third embodiment of the present invention is described below in conjunction with FIGS. 6, 7, 8 and 9A to 9F. The same portions as those of FIGS. 1 to 5 are denoted by the same reference numerals.

Figure 6:
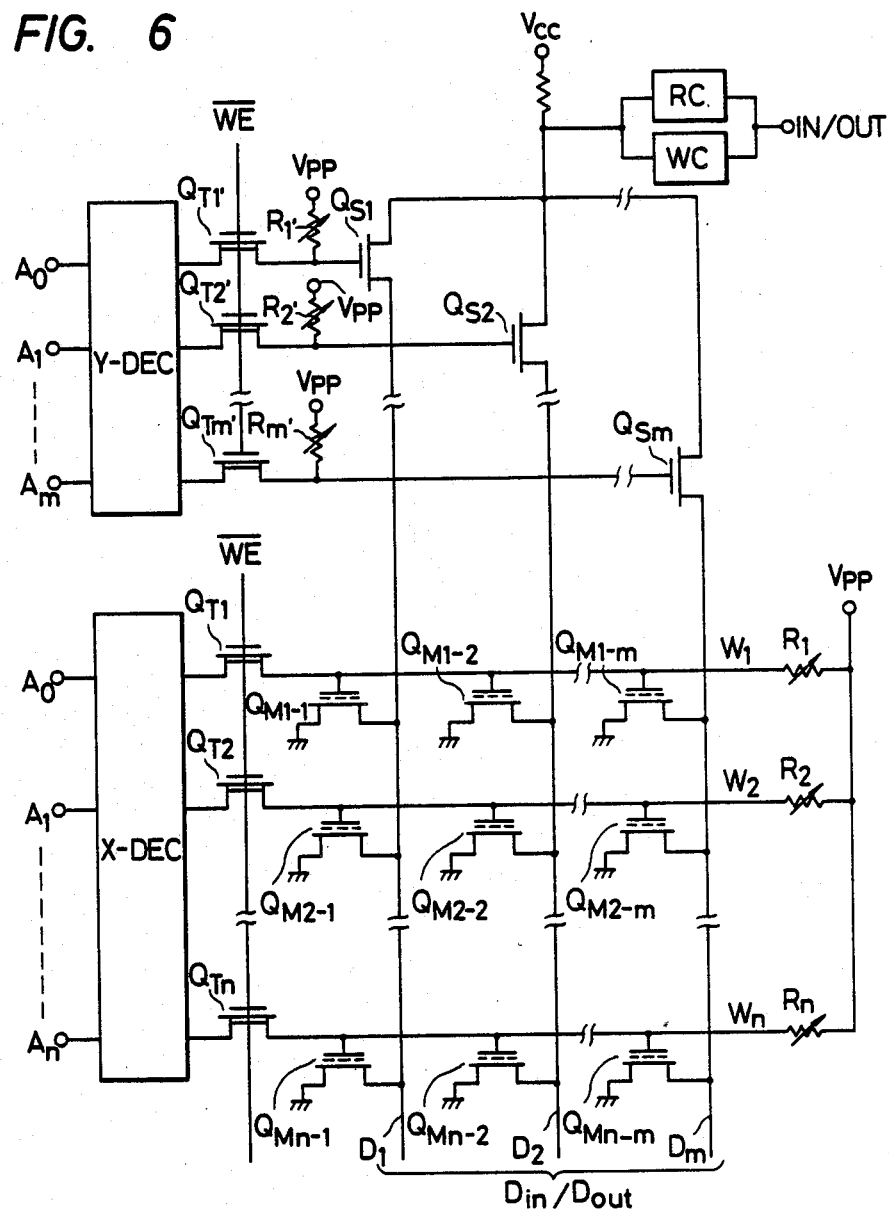
FIG. 6 is a diagram of an equivalent circuit of an EPROM according to a third embodiment of the present invention.

FIG. 6 illustrates the circuit setup of the EPROM, in which memory cells arrayed in the vertical and lateral directions are made up of double gate construction N-channel MISFET's ($Q_{M1-1}$-$Q_{M1-m}$) to ($Q_{Mn-1}$-$Q_{Mn-m}$) having a floating gate and a control gate. Common word lines $W_1$, $W_2$,-$W_n$ connecting the control gates, and common bit lines $D_1$-$D_m$ connecting the drains, are arrayed in a crossing manner in the form of a matrix. The ends on one side of the word lines are connected to the X decoder X-DEC via depletion mode transfer gates $Q_{T1}$-$Q_{Tn}$, and the ends on the other side are connected to the power supply terminal $V_{PP}$ via variable-resistance elements $R_1$-$R_n$ which constitute pull-up circuits for charging the word lines. The individual bit lines are connected to a reading circuit and to a writing circuit through a common bit line via switching MISFET's $Q_{S1}$-$Q_{Sm}$. Further, gates of the FET's $Q_{S1}$-$Q_{Sm}$ are connected to the Y decoder Y-DEC via depletion mode transfer gates $Q_{T1}'$-$Q_{Tm}'$. Variable-resistance elements $R_1'$-$R_m'$ of the pull-up circuits are connected between the power-supply terminal $V_{PP}$ and points where FET's $Q_{S1}$-$Q_{Sm}$ and transfer gates $Q_{T1}'$-$Q_{Tm}'$ are connected together.

In order to reduce the electric power consumption of this EPROM, the peripheral circuits such as decoders X-DEC and Y-DEC, reading and writing circuits, etc. are all constructed using CMOS transistors. Here, attention should be paid to the fact that MISFET's (variable-resistance elements) $Q_{P1}$-$Q_{Pn}$, $Q_{P1}'$-$Q_{Pm}'$ having a high-resistance polycrystalline silicon film as a channel portion, are used as resistance elements $R_1$-$R_n$, $R_1'$-$R_m'$ in the pull-up circuits on the side of the power supply $V_{pp}$, instead of depletion mode MISFET's, to apply the high voltage. This will be described below in detail with reference to FIGS. 7 and 8.

Figure 7:
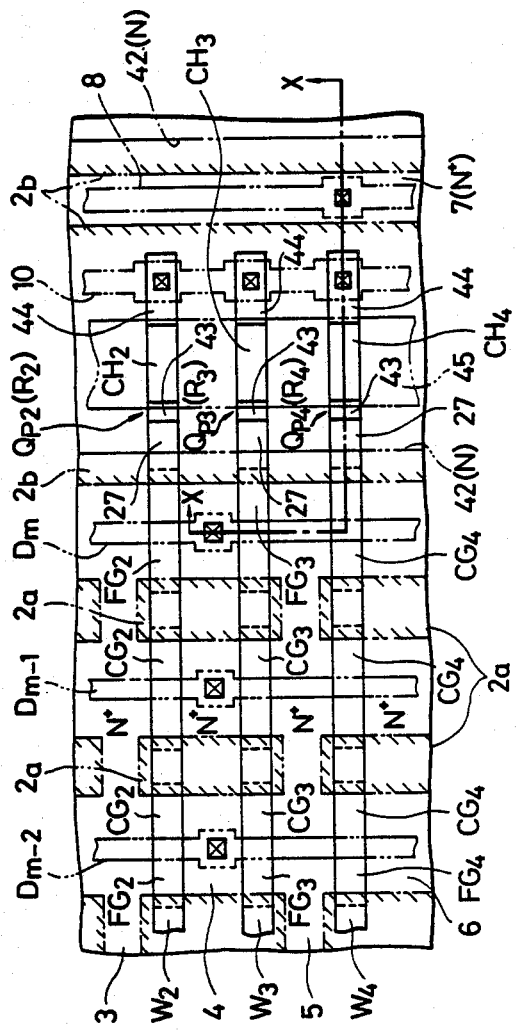
FIG. 7 is a plan view showing a portion of the memory cells and pull-up circuit in the EPROM of FIG. 6.
Figure 8:
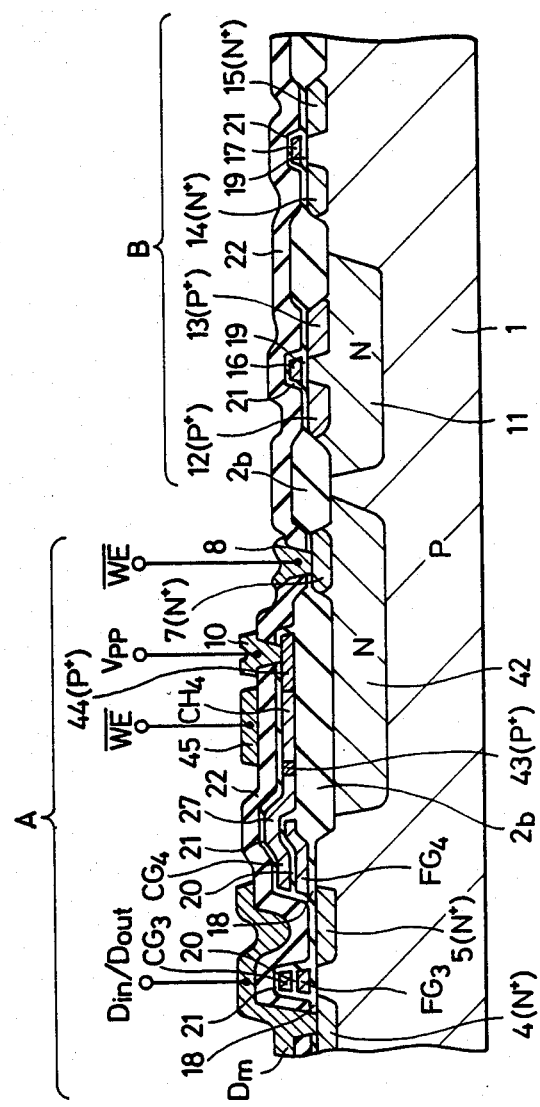
FIG. 8 is a section view of which portion A illustrates a part along the line X—X of FIG. 7, of which portion B illustrates a part of peripheral circuit elements.

FIG. 7 shows pull-up circuits for the three word lines $W_2$, $W_3$ and $W_4$, and FIG. 8 is a section view of which portion A illustrates a part along the line X—X of FIG. 7, of which portion B illustrates a part of peripheral circuit elements. Pull-up circuits for other word lines, and resistors $R_1'$-$R_m'$, are constructed in the same manner as in FIGS. 7 and 8, and are not shown here. The memory cells are divided by field SiO$_2$ films 2a formed on one main surface of the P-type silicon substrate 1. Further, the memory cell portion A is separated from the peripheral circuit element portion B such as decoders by a field SiO$_2$ film 2b. The channel stopper under the field SiO$_2$ films has been omitted to simplify the diagram. The memory cells consist of N+-type diffusion regions 3, 4, 5 and 6 formed in the substrate 1, control gates CG$_2$, CG$_3$ and CG$_4$ formed as portions of word lines composed of polycrystalline silicon films, and floating gates FG$_2$, FG$_3$ and FG$_4$ composed of polycrystalline silicon films under the control gates. The control gates stretch as word lines onto the field SiO$_2$ film 2b, and the portions of them not treated with phosphorus or injected with ions serve as high-resistance channel portions CH$_2$, CH$_3$ and CH$_4$ of MISFET's Q$_{P2}$, P$_{P3}$ and Q$_{P4}$ which constitute pull-up circuits. These MISFET's are all constructed in the same manner. For example, MISFET Q$_{P4}$, shown in FIG. 8, consists of an N-type well 42 formed in the substrate 1 as a gate electrode, a field SiO$_2$ film 2b on the well 42 as a gate oxide film, and P+-type polycrystalline films 43, 44 formed in the same polycrystalline silicon film on both sides of the channel portion CH$_4$ as source and drain regions. N+-type polycrystalline silicon film 27 which serves as a word line W$_4$ is applied to the P+-type polycrystalline film 43, and the power supply voltage V$_{PP}$ is applied to the P+-type polycrystalline silicon film 44. Further, a gate electrode 45 composed of aluminum is formed on the SiO$_2$ film 21 on the surface of the channel portion CH$_4$ and on the phosphorus silicate glass film 22. A write enable signal voltage $\overline{WE}$, the same as the one applied to the N-type well 42, is applied to the gate electrode 45. The polycrystalline silicon films CH$_2$, CH$_3$ and CH$_4$ that serve as channel portions are composed of the same second layer polycrystalline silicon film as the word lines (and control gates). The P-type polycrystalline silicon films 44 at their ends are connected to a common aluminum wiring 10 which is connected to the power supply V$_{PP}$. The well 42 is formed in common for MISFET's Q$_{P2}$, Q$_{P3}$, Q$_{P4}$,–, and the signal voltage $\overline{WE}$ is applied through a common aluminum wiring 8 via N+-type diffusion region 7 formed in the well. In this embodiment, peripheral circuits 3 such as the decoders are constructed of CMOS as shown in FIG. 8, so electric power consumption is reduced. In FIG. 8, reference numeral 11 denotes an N-type well, 12 and 13 denote P+-type diffusion regions, 14 and 15 denote N+-type diffusion regions, 16 and 17 denote gate electrodes composed of the second polycrystalline silicon layer, 18 and 19 denote gate oxide films, and 20 and 21 denote SiO$_2$ films on the surfaces of the polycrystalline silicon films.

As mentioned above, the third embodiment features the construction in which high-resistance polycrystalline silicon films CH$_2$, CH$_3$ and CH$_4$ are formed as a common channel, and P-channel MISFET's Q$_{P2}$, Q$_{P3}$, Q$_{P4}$,–, which serve as variable-resistance elements, are formed by the MISFET's which have field SiO$_2$ film 2b, SiO$_2$ film 21 and glass film 22 as gate oxide films. When data is to be read, therefore, voltages V$_{PP}$=5 volts and $\overline{WE}$=5 volts should be applied. An inverted layer is not induced in the channel portions CH$_2$, CH$_3$, CH$_4$,—and hence the drain current I$_{DS}$ is substantially shut off, and the MISFET's assume the non-conductive state. The leakage current which flows in this case is as small as about 10$^{-11}$ A. Therefore, the current which flows from the power supply V$_{PP}$ to the decoder via the word line can be greatly reduced (less than 100 nA as a whole); i.e., the electric current consumption can be strikingly reduced, and the operation of the peripheral circuits can be stabilized. In this case, the electric resistance in the channel portions CH$_2$, CH$_3$, CH$_4$,-should be greater than 10$^6$ ohms, and preferably 10$^7$ to 10$^8$ ohms or greater. The resistance must be far greater than the resistance (5×10$^5$ ohms) of the depletion mode MISFET's. Namely, in the circuit of FIG. 6, when, for example, Q$_{M2-1}$ in the not-selected line is rendered conductive under the reading operation, channels of the MISFET's that serve as variable resistors R$_1$-R$_n$ assume a high resistance, and only a very small electric current is allowed to flow into the decoder X-DEC via word line W$_2$ and transistor Q$_{M2-1}$. On the side of the Y decoder Y-DEC, also, variable resistors R$_1'$-R$_m'$ consisting of channel portions of the MISFET's assume high resistance and, hence, only a very small current is allowed to flow into the Y decoder Y-DEC. Consequently, the electric current which flows into the decoders when the data is to be read can be greatly reduced as a whole, making it possible to reduce the electric power consumption to a degree comparable with that of CMOS devices. In this sense, the resistors R$_1$-R$_n$, R$_1'$-R$_m'$ must have resistances greater than 10$^7$ ohms.

Unlike the depletion mode MISFET's, these variable resistors work to reduce the current when data is to be read. Therefore, there is no need to increase the size of the elements. Or, rather, the size (especially, the width and thickness of the channel portions) may be slightly changed to obtain a desired high resistance. Therefore, since the size can be reduced compared with depletion mode MISFET's, the EPROM can be constructed in a densely integrated form.

According to the third embodiment, furthermore, the MISFET's Q$_{P2}$, Q$_{P3}$, Q$_{P4}$,—are rendered conductive when data is to be written and, hence, the channel resistances are reduced sufficiently. That is, in FIG. 8, if the power supply voltage V$_{PP}$ is set to 21 volts (or 25 volts) for writing data, and $\overline{WE}$ to 0 volt, an inverted layer is sufficiently induced in the channel portion CH$_4$ due to upper and lower MISFET construction having channel portion CH$_4$ in common, and a heavy drain current I$_{DS}$ flows into the word line with the inverted layer as a current path. Consequently, the charging speed for the word lines can be greatly increased, and the data can be read at high speeds. Further, since the polycrystalline silicon film is used for the channel portion, a sufficiently great withstand voltage is obtained when data is to be read. Moreover, even if a breakdown occurs in the PN junction in the polycrystalline silicon film which forms the channel portion CH$_4$, carries from the breakdown do not affect the substrate since the polycrystalline silicon film has been separated from the substrate.

The MISFET's in the pull-up circuits according to the third embodiment can be formed without modifying the conventional process for producing EPROM's. This is described below with reference to a manufacturing process in conjunction with FIGS. 9A to 9F.

First, as shown in FIG. 9A, N-type wells 11, 42 and a field SiO$_2$ film 2b are formed on one main surface of the P-type silicon substrate 1 by diffusion and selective oxidation techniques. After a gate oxide film 18 is formed, polycrystalline silicon film is grown on the entire surface by CVD technique, and it is patterned by photoetching to form a polycrystalline silicon film 23 of a predetermined shape after it has been treated with phosphorus in a conventional manner. The surface of the polycrystalline silicon film 23 is then oxidized to form a thin SiO$_2$ film. The gate oxide film 18 on the side of peripheral circuits is removed and a new gate oxide film 19 is formed, or the gate oxide film 18 may be used as the gate oxide film on the side of peripheral circuits.

A second polycrystalline silicon film layer 24 is then deposited on the entire surface by CVD as shown in FIG. 9B, and predetermined portions thereof are covered with a SiO$_2$ film 25 (mask) by CVD, followed by the treatment with phosphorus. The polycrystalline silicon film 24 not covered with the mask 25 becomes N+-type, and the polycrystalline silicon film beneath the mask 25 remains a high-resistance polycrystalline silicon film 24'.

The mask 25 is then removed by etching as shown in FIG. 9C, and the polycrystalline silicon film 24, SiO$_2$ film 20, polycrystalline silicon film 23, and SiO$_2$ film 18 are successively etched in the same pattern. Thus, polycrystalline silicon films 26 and 27 in the form of control gates, polycrystalline silicon films 28 and 29 in the form of floating gates, and polycrystalline silicon films 30 and 31 in the form of gate electrodes of peripheral circuits, are formed, and the gate oxide films 18, 19 on both sides of the polycrystalline silicon films 28, 29, 30 and 31, are removed to expose the substrate 1.

Thereafter, the surfaces of the polycrystalline silicon films 26, 27, 24', 30, 31, and the surface of the exposed substrate are slightly oxidized by heating to form a thin SiO$_2$ film 34 on the surfaces as shown in FIG. 9D. Another SiO$_2$ film is then formed on the polycrystalline silicon films and the substrate by CVD. The SiO$_2$ film is then subjected to selective etching to form masks 32, 33 that cover the high-resistance polycrystalline silicon film 24' and the well region 11. Through the etching for forming the masks, the thin SiO$_2$ film 34 is removed except the portions under the masks 32, 33. The entire surface is then irradiated with a beam 35 of arsenic ions to selectively inject arsenic ions into the exposed surface of the substrate, and it is annealed in nitrogen. Thus, N$^+$-type diffusion regions 4, 5, 14, 15 as source and drain regions, and N$^+$-type region 7 for feeding electricity to the well, are formed in the substrate 1.

The masks 32, 33 are then removed as shown in FIG. 9E, a new SiO$_2$ film is deposited by the CVD method on the substrate 1, followed by etching to form a SiO$_2$ film 36 on predetermined portions so as to partially cover the high-resistance polycrystalline silicon layer 24'. Using the SiO$_2$ film 36 as a mask, the whole surface of the substrate is irradiated with a beam 38 of boron ions to form P$^+$-type diffusion regions 12, 13 that serve as source or drain regions in the well 11. At the same time, boron ions are injected into the high-resistance polycrystalline silicon film 24' on both sides of the mask 36 to form P$^+$-type polycrystalline silicon films 43, 44. These P$^+$-type polycrystalline silicon films serve as sources or drains of the P-channel MISFET Q$_{P4}$ (variable resistor R$_4$), and define a channel portion CH$_4$. By determining the pattern of mask 36, therefore, the channel length can be precisely controlled.

Referring to FIG. 9F, the mask 36 is removed, and the surfaces are lightly heat treated in an oxidizing atmosphere to form an SiO$_2$ film and thereby to form gate electrodes CG$_3$, CG$_4$, FG$_3$, FG$_4$, 16 and 17 of the MISFET's. Then, a phosphorus silicate glass film 22 deposited on the entire surface by the CVD method and the underlying SiO$_2$ film are removed by photoetching to form through holes 37, 39 and 40 for contacts.

Aluminum is then deposited on the entire surface by vacuum evaporation and patterned by photoetching to form aluminum wirings such as bit line D$_m$, power supply line 10, wiring 8 for applying $\overline{WE}$, and gate electrode 45 as shown in FIG. 8.

Figure 10:
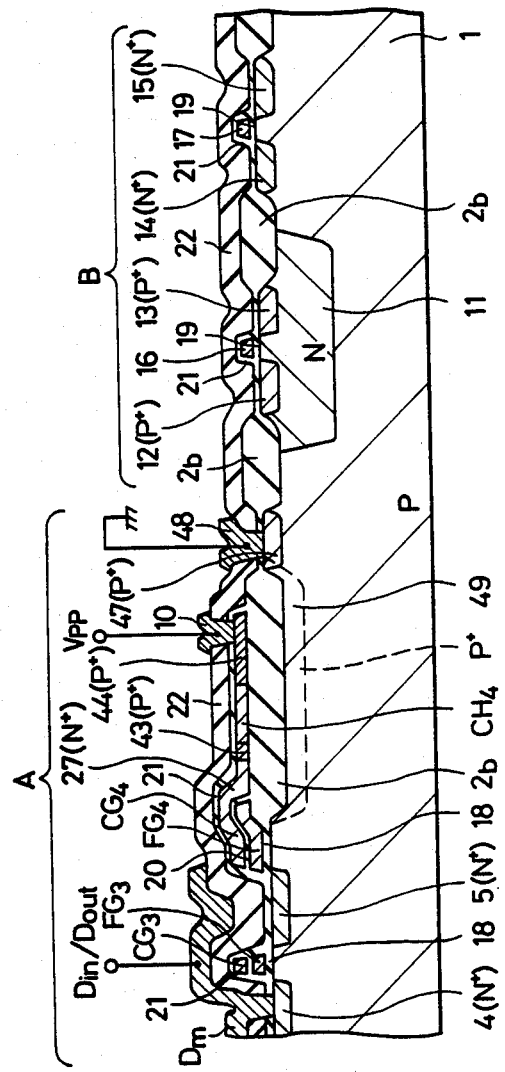
FIG. 10 is a section view showing a fourth embodiment of the present invention.

FIG. 10 shows the construction according to a fourth embodiment of the present invention.

FIG. 10 corresponds to the section view of FIG. 8, but the embodiment of FIG. 10 is different from the third embodiment in that the substrate 1 is utilized as the gate of MISFET Q$_{P4}$ which works as a variable-resistance element in the pull-up circuit, and in that the gate electrode 45 (refer to FIG. 8) is not formed on the channel portion CH$_4$. Further, a P$^+$-type diffusion region 49 (which also works as a channel stopper) is formed under the field SiO$_2$ film 2b contiguous with P$^+$-type diffusion region 47 that sets the substrate 1 to ground level through ground line 48. Therefore, since the P$^+$-type region 49 functions as a gate electrode of ground level (0 volt), the voltage V$_G$ becomes $-21$ volts when data is to be written (V$_{PP}$=21 volts), and $-5$ volts when data is to be read (V$_{PP}$=5 volts).

Figure 11:
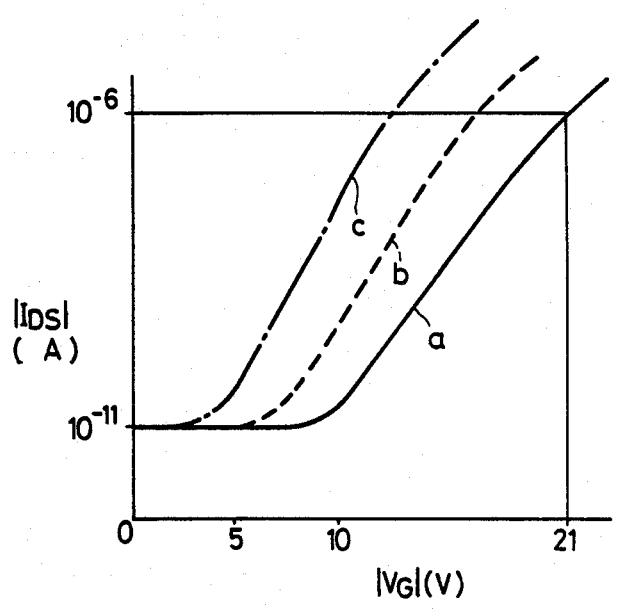
FIG. 11 is a graph showing the relation between the gate voltage and the drain current.

Therefore, the drain current I$_{DS}$ which flows through the channel portion CH$_4$ changes as indicated by curve a in FIG. 11. In this case, the thickness of the field SiO$_2$ film 2b (gate oxide film) is 6000 angstroms. Therefore, a large drain current I$_{DS}$ ($10^{-6}$ A) flows when data is to be written, and a very small current ($10^{-11}$ A) flows when data is to be read, contributing to the increase in the stability of operation. When the gate oxide film is composed of a SiO$_2$ film (a film formed by oxidizing the surface of the polycrystalline silicon film, and having a thickness of 1000 angstroms), the characteristics become as shown by curve b in FIG. 11. When the gate oxide film is composed of an ordinary gate SiO$_2$ film (having a thickness of 750 angstroms) which is formed by thermally oxidizing the single crystal silicon, the characteristics become as shown by curve c in FIG. 11. This fact indicates that with the SiO$_2$ film or gate SiO$_2$ film, the drain current I$_{DS}$ is easily changed when data is to be read (V$_G$=$|-5$ volts$|$) by grounding the gate. The drain current changes particularly greatly in curve c. This tendency becomes conspicuous when the gate is set to a negative level [i.e., when V$_G$=$|(-7$ volts$)|$ to $|(-10$ volts$)|$]. According to this embodiment in which the gate oxide film is employed as a field SiO$_2$ film, however, the drain current I$_{DS}$ is stabilized as represented by curve a, and the leakage current can be reduced strikingly.

In the third embodiment mentioned earlier, provision of the gate electrode 45 enables a large drain current I$_{DS}$ to flow when data is to be written. In the embodiment of FIG. 10, however, the only drain current I$_{DS}$ from the substrate side is controlled, and a small current I$_{DS}$ flows. The third embodiment may become the same as the embodiment of FIG. 10 if the gate electrode 45 is floated or set to ground. A larger drain current, however, is allowed to flow when the gate electrode is provided than when the gate electrode is not provided.

In the embodiment of FIG. 10, furthermore, the high-resistance polycrystalline silicon film connected to the power supply V$_{PP}$ is formed on the field SiO$_2$ film and is separated from the substrate 1. Therefore, no parasitic transistor is formed with the elements (peripheral circuit elements) in the CMOS portion B of FIG. 8, the latch-up phenomenon is effectively prevented, and the operation is carried out stably.

Figure 12:
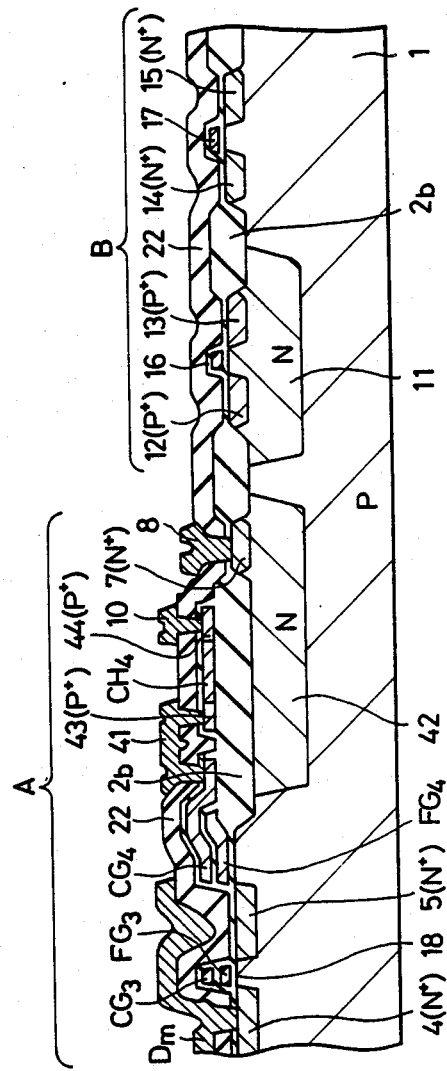
FIG. 12 is a section view illustrating a fifth embodiment of the present invention.

FIG. 12 shows a fifth embodiment according to the present invention. In this embodiment, unlike the embodiment of FIG. 8, the source, drain and channel portions of the MISFET Q$_{P4}$ in the pull-up circuit are composed of polycrystalline silicon films, and are connected to the control gate CG$_4$ through an aluminum wiring 41. This construction also makes it possible to obtain high-resistance elements that exhibit the same functions and effects as those of the aforementioned embodiments without any need of modifying the manufacturing process.

The manufacturing process consists of leaving some of the first polycrystalline silicon film for the field SiO$_2$ film 2b in the step of FIG. 9A, oxidizing the surface of the first polycrystalline silicon film layer, depositing the second polycrystalline silicon film layer, followed by the patterning as shown in FIG. 9C, and oxidizing the surface of the film. In this case, the polycrystalline silicon film of the control gate CG4 is so patterned that it is separated from the polycrystalline silicon film as shown in FIG. 12. Arsenic ions are then injected as shown in FIG. 9D with the SiO2 film formed by the CVD method as a mask, to thereby form N+-type regions. Here, the surface of the polycrystalline silicon film on the side of the channel portion CH4 should be covered with a mask (SiO2). Boron ions are thereafter injected in the same manner as that of FIG. 9E, the surface is oxidized, and phosphorous silicate glass is deposited in the same manner as in FIG. 9F. After holes are formed through the glass film, aluminum is vapor-deposited and patterned to form aluminum wirings $D_m$, 41, 10, etc.

Figure 13:
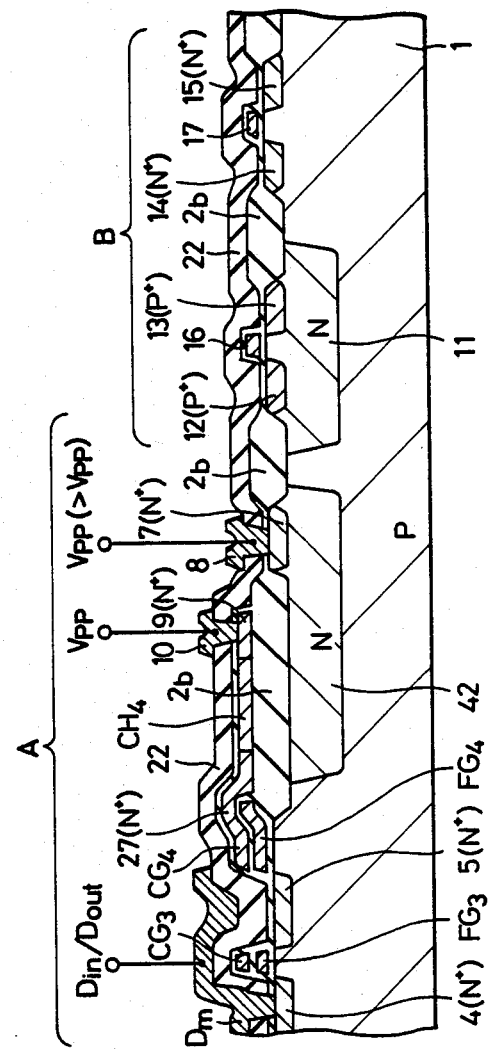
FIG. 13 is a section view which illustrates a sixth embodiment of the present invention.

FIG. 13 shows a sixth embodiment of the present invention.

In this embodiment, unlike the embodiment of FIG. 8, the MISFET in the pull-up circuit has an N-channel and is served, through the gate electrode 42, with a voltage equal to, or greater than, the voltage $V_{PP}$ applied to the drain 9. The variable resistance element, therefore, is an N-channel MISFET. To write data (with $V_{PP}=21$ volts), therefore, a voltage equal to, or greater than, $V_{PP}$ is applied to the gate electrode to render the FET conductive. To read data, a voltage of 5 volts or greater is applied to the gate electrode to render the FET nonconductive. In this case, since a resistance component is introduced in the channel portion of FET, the gate voltage should be greater than $V_{PP}$.

In forming the N-channel MISFET, boron ions should not be injected into the channel portion in the step of FIG. 9E.

Figure 14:
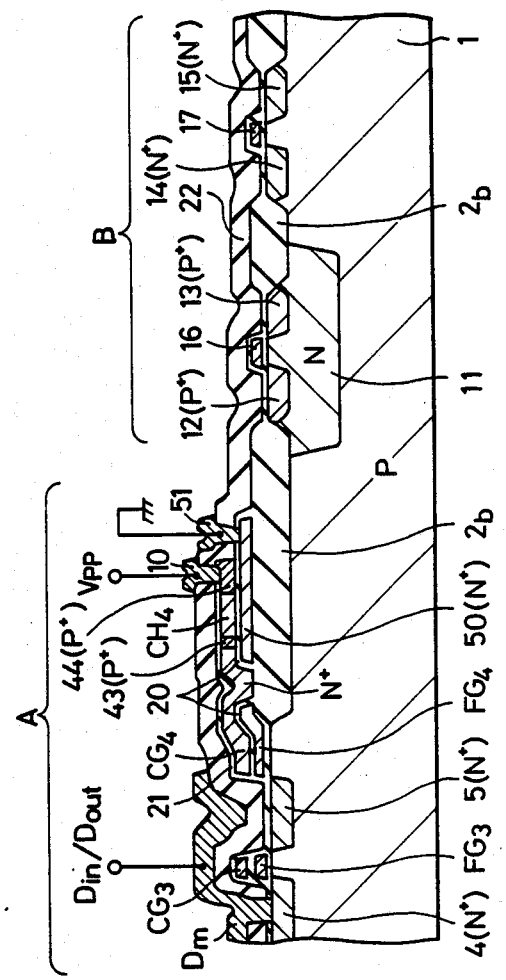
FIG. 14 is a section view which illustrates a seventh embodiment of the present invention.

FIG. 14 shows a seventh embodiment according to the present invention.

In this embodiment, the MISFET in the pull-up circuit consists of polycrystalline silicon films of double-layer construction, the polycrystalline silicon film 50 of the lower layer serving as the gate electrode, and high-resistance polycrystalline silicon film in the upper layer serves as the channel portion CH4. In FIG. 14, reference numeral 51 denotes an aluminum wiring for grounding the gate electrode. Like the polycrystalline silicon film 23 of FIG. 9A, the gate electrode 50 is left on the field SiO2 film 2b by the first polycrystalline silicon film layer, and is treated with phosphorus to make it N+-type together with the polycrystalline silicon film 23. In the step of FIG. 9D, the second polycrystalline silicon layer contiguous with the control gate CG4 is left on the gate electrode 50 being partly overlapped. Further, P+-type regions 43, 44 are formed on both sides of the channel portion CH4 by the injection of arsenic ions 35 and boron ions 38 (FIG. 9E).

In this embodiment, the reading and writing operations can be performed stably relying upon the MISFET construction, like the above-mentioned embodiment. The writing speed can be sufficiently increased. However, since the gate oxide film consists of an oxide film 20 (having a thickness of 1000 to 1200 angstroms) formed by oxidizing the surface of the polycrystalline silicon film 50 of the first layer, the drain current $I_{DS}$ vary to some extent when the gate voltage $V_G$ is changed to read data, as mentioned with reference to FIG. 11. The problem, however, does not arise when the gate is grounded; the drain current $I_{DS}$ can be sufficiently reduced and stabilized.

Figure 15:
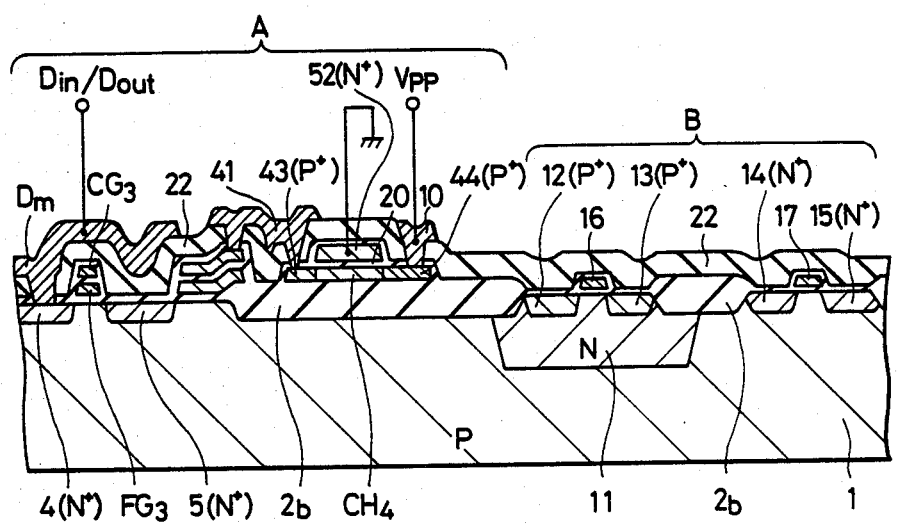
FIG. 15 is a section view showing an eighth embodiment of the present invention.

FIG. 15 shows an eighth embodiment of the present invention. Compared with the embodiment of FIG. 14, the embodiment of FIG. 15 has a gate electrode 52 composed of a polycrystalline silicon film of the second layer, and has a polycrystalline silicon film of the first layer on the side of the channel CH4 connected to the control gate CG4 through an aluminum wiring 41, like the embodiment of FIG. 12.

The construction of this embodiment also makes it possible to obtain variable-resistance elements (MISFET's) composed of polycrystalline silicon films of the double-layer construction like the embodiment of FIG. 12.

Figure 16:
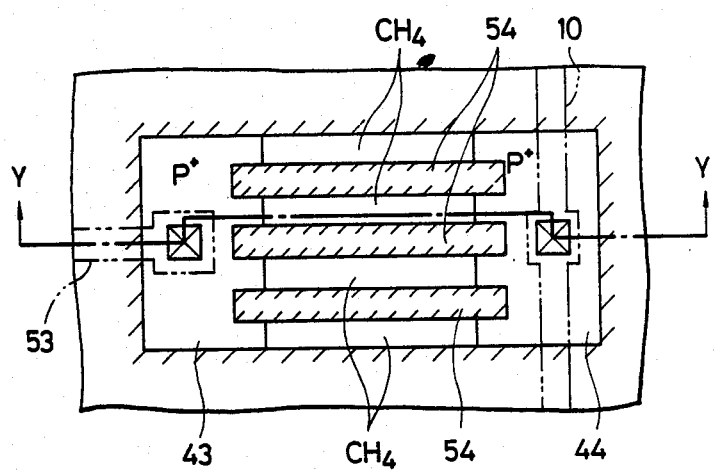
Figure 17:
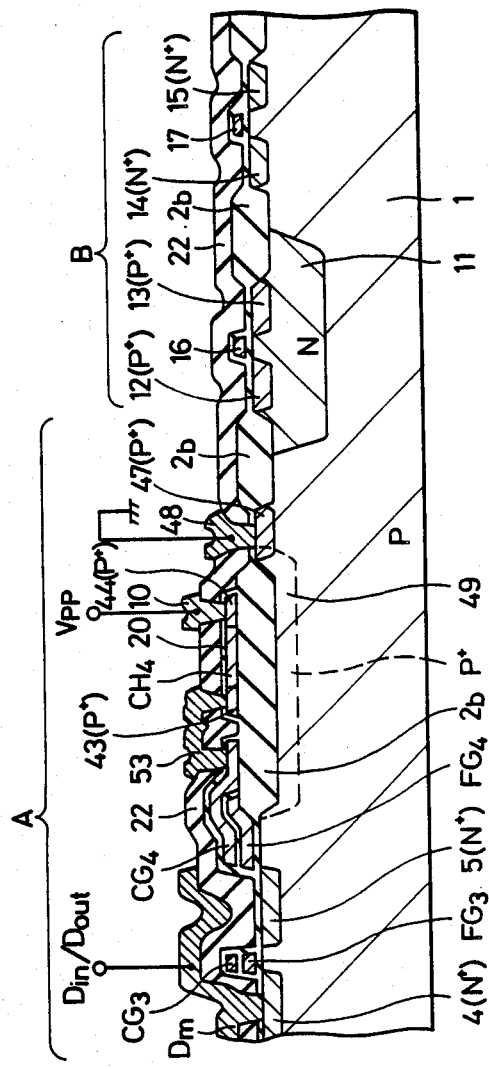

FIGS. 16 to 19 show a ninth embodiment of the present invention. Variable-resistance elements according to the ninth embodiment are formed by modifying the construction of FIG. 10. That is, the channel portions CH4 are composed of a polycrystalline silicon film of the first layer as shown in FIG. 12, and are connected to the control gates CG4 through aluminum wirings 53. Here, for instance, four channel portions CH4 are connected in parallel as shown in FIG. 16. There is no polycrystalline silicon film in the portions 54 among these channels; i.e., the channels are separated from each other by an insulating film (such as SiO2 film 20, glass film 22, or the like).

According to this construction, a plurality of variable-resistance elements are connected in parallel between the power source $V_{PP}$ and the word lines, making it possible to increase the charging current that flows into the word lines when data is to be written. Namely, the inventors of the present invention have discovered the fact that with the MISFET in which a high-resistance polycrystalline silicon film is used for the channel portion, the drain current $I_{DS}$ flows without being affected by the channel width W (the current does not increase with the increase in the channel width) provided the gate oxide film has an increased thickness, and have found that the drain current $I_{DS}$ can therefore be increased by n times depending upon the number (n) of the channel portions CH4 arrayed in parallel as shown in FIG. 16.

Figure 18:
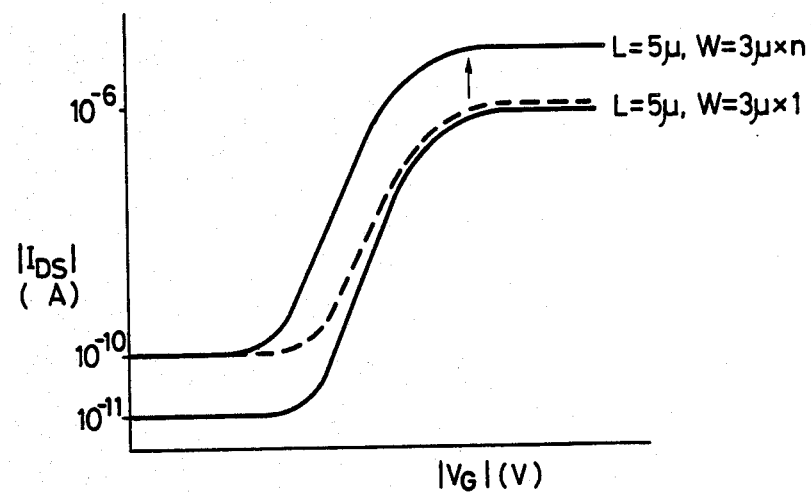

FIG. 18 illustrates the fact that when the number of channel portions is increased with the channel length L maintained constant, the drain current $I_{DS}$ increases strikingly with the increase in the gate voltage $V_G$, but does not substantially increase if the channel width is simply increased (in this case, the number of channels is one), as indicated by a broken line. Thus, with the construction of this embodiment, a large current is permitted to flow when data is to be written, and the speed for charging the word lines can be greatly increased.

Figure 19:
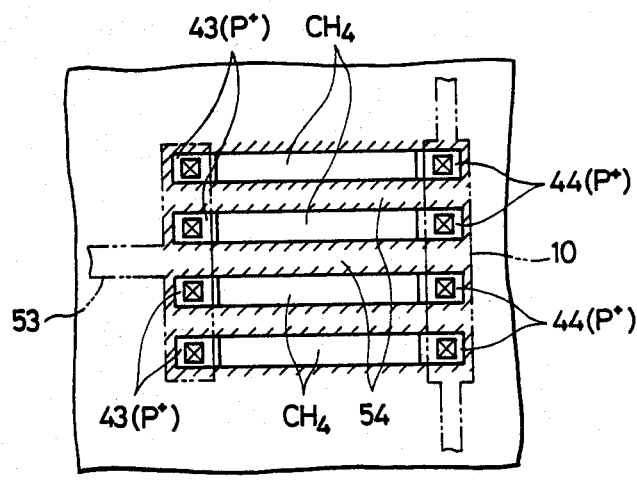

The channel portions CH4 may be connected in parallel as shown in FIG. 19. Namely, the P+-type regions 43, 44 are arrayed in an isolated manner, and contacts of the wirings 10, 53 are connected to these P+-type regions.

The channel portions arrayed in parallel can be easily formed through an ordinary manufacturing process by patterning the polycrystalline silicon film of the first layer (or the second layer) by photoetching.

Figure 20:
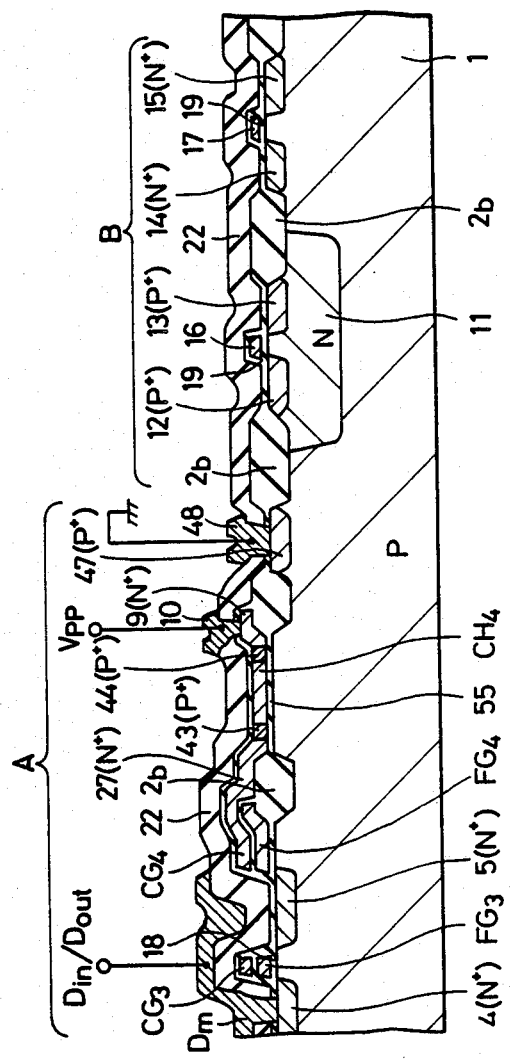
FIG. 20 is a section view showing a tenth embodiment of the present invention.

FIG. 20 shows a tenth embodiment of the present invention. The feature of this embodiment is that the gate oxide film of the MISFET constituting the variable-resistance element in the pull-up circuit is composed of an oxide film 55 on the surface of the silicon substrate 1 which is used as a gate electrode. Other portions are substantially the same as those of FIG. 10. The gate oxide film 55, in this case, is formed through the same steps as those of forming the gate oxide film 19 of the peripheral circuits 3.

This embodiment makes it possible to obtain the same functions and effects as those of the above-mentioned embodiments (for example, of FIG. 10). Further, good MOS characteristics can be exhibited since the MISFET which serves as a variable-resistance element has a gate oxide film composed of an oxide film on the surface of the single crystal silicon. Moreover, the device can be prepared without substantially modifying the process for producing ordinary EPROM's or requiring any additional steps.

Figure 21:
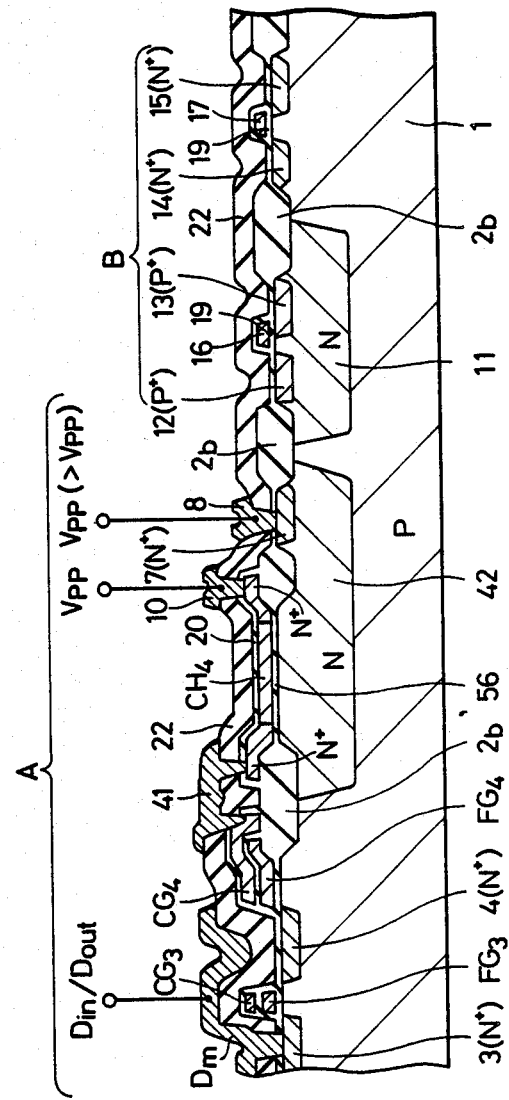
FIG. 21 is a section view showing an eleventh embodiment of the present invention.

FIG. 21 illustrates an eleventh embodiment of the present invention. In this embodiment, the surface of the single crystal silicon is oxidized to form a gate oxide film 56 through the same step as that of forming the gate oxide film 18 of the memory cell. However, the feature of this embodiment is that the channel portions $CH_4$ are composed of a polycrystalline silicon film of the first layer. The gate electrode consists of an N-type well 42 which is served with the power supply voltage $V_{PP}$ or a higher voltage from the aluminum wiring 8 via an $N^+$-type diffusion region 7. Here, the MISFET is an N-channel-type and is connected to the word line through an aluminum wiring 41.

Figure 22:
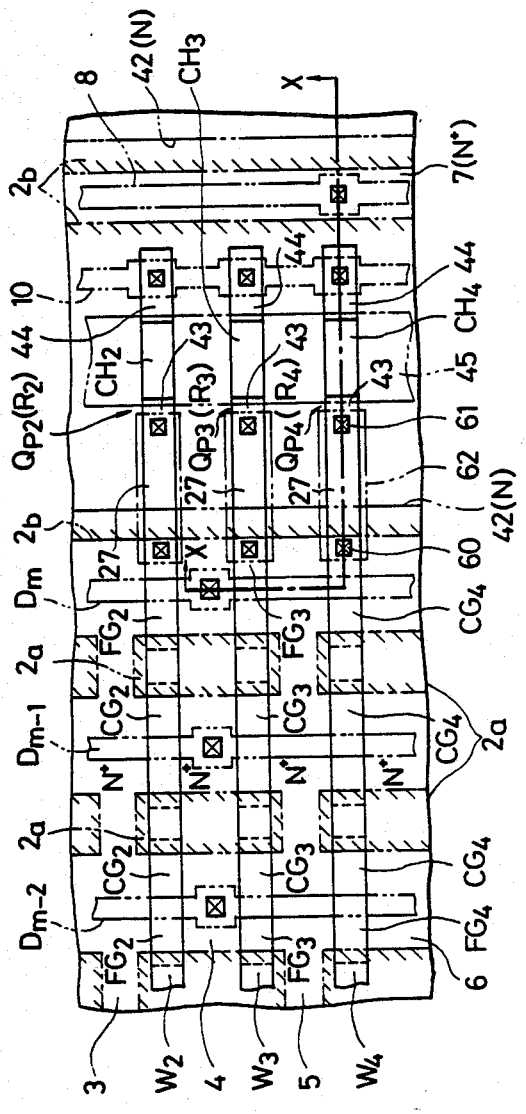
FIGS. 22 and 23 illustrate a twelfth embodiment of the present invention.
Figure 23:
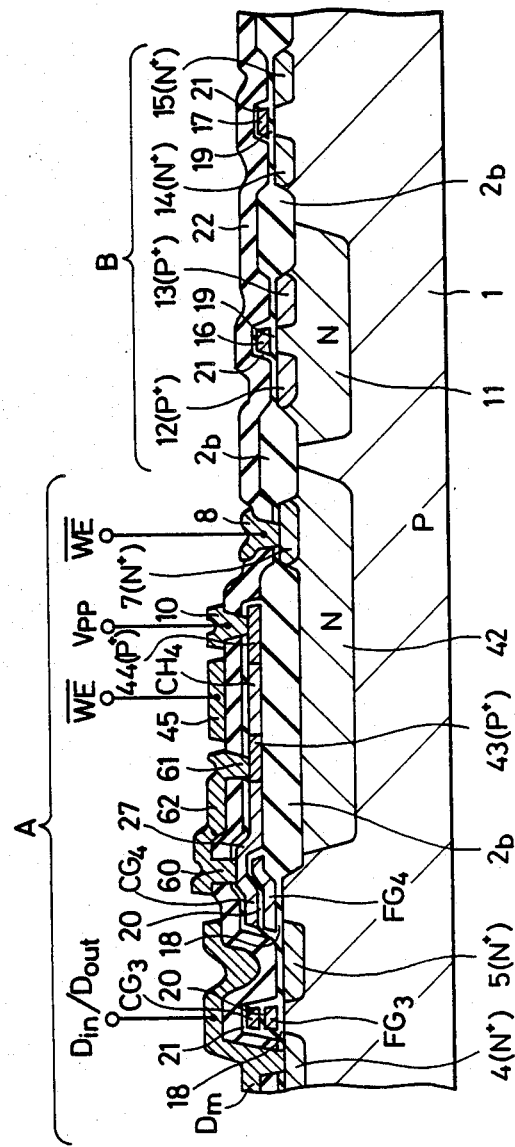

FIGS. 22 and 23 illustrate a twelfth embodiment of the present invention. This embodiment is a partial modification of the third embodiment of FIG. 8. In FIG. 22, the $P^+$-type regions 43 of the MISFETs used as variable-resistance elements in the pull-up circuit and the $N^+$-type polycrystalline silicon layers 27 constituting the word lines are electrically connected together with aluminum wirings 62. The aluminum wirings 62 and the $P^+$-type regions 43 are connected at connection portions 61. Since the $P^+$-type regions of the polycrystalline silicon film and the $N^+$-type regions are connected together through aluminum wirings, it is possible to eliminate the voltage drop that develops across the $P^+$-$N^+$ junction formed between the above-mentioned individual regions. Accordingly, the power-supply voltage from the power supply terminal $V_{PP}$ can be efficiently applied to the control gate of the memory cell. FIG. 23 is a section view taken along line X—X of FIG. 22, and which also shows a peripheral circuit element portion B. The memory cell portion A such as MISFET's in the pull-up circuits consisting of a polycrystalline silicon film formed on the $N^+$-type diffusion regions 4, 5, control gates $CG_3$, $CG_4$, floating gates $FG_3$, $FG_4$, bit line $D_m$, and field $SiO_2$ film 2b, and the peripheral circuit element portion B, are nearly the same as those of FIG. 8. However, there is a difference in that the $P^+$-type source region 43 of the polycrystalline silicon film constituting the MISFET in the pull-up circuit, and the polycrystalline silicon film 27 constituting the control gate $CG_4$ are electrically connected together with an aluminum wiring 62.

Although the present invention has been described above, the embodiments can be further modified without departing from the technical spirit and scope of the invention. For example, the construction of the MISFET which serves as a variable-resistance element in the pull-up circuit may be modified in a variety of other ways; i.e. the surface of single crystal silicon may be oxidized to form a gate oxide film, and a MISFET of a polycrystalline silicon film of double-layer construction as shown in FIG. 15 may be formed thereon. Further, the gate voltage (gate bias) may be applied by a variety of methods. Moreover, the polycrystalline silicon film constituting the channel portion may be converted into a single crystal by the widely known laser beam annealing method to form a single crystal silicon film. It is further possible to change the MOS characteristics by doping the channel portions of high-resistance polycrystalline silicon with impurities by ion injection. Not only limited to the above-mentioned EPROM, the present invention can also be adapted to EAROM (electrically alterable ROM), as well as to any other nonvolatile memories that are used with high power source voltages $V_{PP}$.

What is claimed is:

1. A nonvolatile memory device comprising:
   a plurality of word lines arranged substantially parallel to one another in a first predetermined direction and each having a first end and a second end;
   a plurality of bit lines arranged substantially parallel to one another in a second predetermined direction so as to traverse said word lines;
   a matrix of nonvolatile memory cells associated individually with a unique pair of said word and bit lines wherein each said nonvolatile memory cell has a control gate electrode which is supplied with a relatively high voltage for a writing operation or a relatively low voltage for a reading operation, said control gate electrode being electrically connected to the corresponding word line with which said nonvolatile memory cell is associated with;
   decoding means, coupled to the first ends of said word lines, for supplying a signal selectively to said word lines;
   a terminal selectively applied with a first voltage during the writing operation of said nonvolatile memory cells and a second voltage lower than said first voltage during the reading operation of said nonvolatile memory cells; and
   a plurality of resistance elements connected respectively between said second ends of said word lines and said terminal, wherein each of said resistance elements is composed of a polycrystalline silicon film or a single crystal silicon film formed over an insulating film on a semiconductor substrate.

2. A nonvolatile memory device according to claim 1, wherein the decoding means are connected to the word lines via insulated gate type field effect transistors.

3. A nonvolatile memory device according to claim 2, wherein said insulated gate type field effect transistors are of depletion type.

4. A nonvolatile memory device according to claim 1, wherein each of said nonvolatile memory cells has a floating gate electrode located between said control gate electrode and said substrate.

5. A nonvolatile memory device according to claim 1, wherein said bit lines are connected to a reading circuit and a writing circuit via switching elements.

6. A nonvolatile memory device according to claim 1, wherein said word lines are composed of polycrystalline silicon film, and are each formed as unitary structures together with the control gate electrodes of the corresponding nonvolatile memory cells.

7. A nonvolatile memory device according to claim 1, wherein said bit lines are each composed of an aluminum layer.

8. A nonvolatile memory device comprising:
   a plurality of word lines arranged substantially parallel to one another in a first predetermined direction and each having a first end and a second end;

a plurality of bit lines arranged substantially parallel to one another in a second predetermined direction so as to traverse said word lines;

a matrix of nonvolatile memory cells associated individually with a unique pair of said word and bit lines wherein each said nonvolatile memory cell has a control gate electrode which is supplied with a relatively high voltage for a writing operation or a relatively low voltage for a reading operation, said control gate electrode being electrically connected to the corresponding word line with which said nonvolatile memory cell is associated with;

decoding means, coupled to the first ends of said word lines, for supplying a signal selectively to said word lines;

a terminal selectively applied with a first voltage during the writing operation of said nonvolatile memory cells and a second voltage lower than said first voltage during the reading operation of said nonvolatile memory cells;

a plurality of resistance elements connected respectively between said second ends of said word lines and said terminal, wherein said resistance elements are each composed of a polycrystalline silicon film or a single crystal silicon film formed over an insulating film on a semiconductor substrate, and further wherein each of said resistance elements has associated therewith a control electrode which adjoins an insulating film covering a surface region of said silicon film constituting the resistance element.

9. A nonvolatile memory device according to claim 8, wherein said control electrodes are metal electrodes formed over the silicon films on an insulating film.

10. A nonvolatile memory device according to claim 8, wherein semiconductor well regions are formed in the semiconductor substrate under the silicon films constituting the resistance elements.

11. A nonvolatile memory device according to claim 8, wherein said control electrodes are comprised of high-concentration regions having the same conductivity type as the semiconductor well regions formed in the semiconductor substrate under the silicon film constituting the resistance elements.

12. A nonvolatile memory device according to claim 8, wherein said resistance elements with control electrodes are comprised of polycrystalline silicon films of a double-layer construction, and wherein the polycrystalline silicon films of the upper layers of said double-layer construction serve as the control electrodes.

13. A nonvolatile memory device according to claim 8, wherein said resistance elements with control electrodes are comprised of polycrystalline silicon films of a double-layer construction, and wherein the polycrystalline silicon films of the lower layers of the double-layer construction serve as the control electrodes.

14. A nonvolatile memory device according to claim 12, wherein the polycrystalline silicon films of the upper layers are connected to the word lines.

15. A nonvolatile memory device according to claim 8, wherein said word lines each are comprised of a polycrystalline silicon film and are formed as unitary structures together with respective resistance elements which have associated control electrodes.

16. A nonvolatile memory device according to claim 8, wherein said word lines each are comprised of a polycrystalline silicon film and are connected to said resistance elements which have control electrodes by respective aluminum layers.

17. A nonvolatile memory device comprising:

a plurality of word lines arranged substantially parallel to one another in a first predetermined direction and each having a first end and a second end;

a plurality of bit lines arranged substantially parallel to one another in a second predetermined direction so as to traverse said word lines;

a matrix of nonvolatile memory cells associated individually with a unique pair of said word and bit lines wherein each said nonvolatile memory cell has a control gate electrode which is supplied with a relatively high voltage for a writing operation or a relatively low voltage for a reading operation, said control gate electrode being electrically connected to the corresponding word line with which said nonvolatile memory cell is associated with;

decoding means, coupled to the first ends of said word lines, for supplying a signal selectively to said word lines;

a terminal selectively applied with a first voltage during the writing operation of said nonvolatile memory cells and a second voltage lower than said first voltage during the reading operation of said nonvolatile memory cells;

a plurality of MISFETs connected respectively between said second ends of said word lines and said terminal, wherein each of said MISFETs has a polycrystalline silicon film or a single crystal silicon film as a channel portion, and wherein said polycrystalline silicon film or said single crystal silicon film is formed over an insulating film on a semiconductor substrate.

18. A nonvolatile memory device according to claim 17, wherein each of said MISFETs has a gate electrode which is comprised of one of a polycrystalline silicon film, an aluminum layer or a semiconductor well region.

19. A nonvolatile memory device according to claim 17, wherein each of said MISFETs has a gate electrode which is comprised of a polycrystalline silicon film and a semiconductor well region.

20. A nonvolatile memory device according to claim 17, wherein each of said MISFETs has a gate electrode which is comprised of an aluminum layer and a semiconductor well region.

21. A nonvolatile memory device according to claim 17, wherein each of said MISFETs has a gate electrode which is formed over an insulating film covering a surface of said channel portion.

22. A nonvolatile memory device according to claim 17, wherein each of said MISFETs has a gate electrode which is formed under the insulating film on the semiconductor substrate.

23. A nonvolatile memory device according to claim 21, wherein the gate electrode is comprised of one of a polycrystalline silicon film or an aluminum layer.

24. A nonvolatile memory device according to claim 23, wherein the gate electrode is comprised of a semiconductor well region.

25. A nonvolatile memory device according to claim 17, wherein said channel portion is comprised of a plurality of channel portions that are connected in parallel with each other.

26. A nonvolatile memory device according to claim 17, wherein the insulating film on which the channel portion is formed is a field $SiO_2$ film that isolates the channel portions.

27. A nonvolatile memory device according to claim 17, wherein the insulating film on which the channel portion is formed is comprised of a gate oxide film.

28. A nonvolatile memory device according to claim 17, which further includes a peripheral circuit including a series circuit of p-channel and n-channel insulated gate type field effect transistors.

29. A nonvolatile memory device according to claim 8, further comprising means coupled to said control electrodes of said resistance elements to control the resistance elements to have a higher resistance during said reading operation than during said writing operation.

30. A nonvolatile memory device according to claim 17, wherein each of said MISFETs has a gate electrode coupled to means for controlling the MISFETs to have a higher resistance during said reading operation than during said writing operation.

31. A nonvolatile memory device according to claim 1, wherein each of said resistance elements has a resistance greater than $10^6$ ohms.

32. A nonvolatile memory device according to claim 31, wherein each of said resistance elements has a resistance between $10^7$ to $10^{10}$ ohms.

33. A nonvolatile memory device according to claim 29, wherein each of said resistance elements has a resistance greater than $10^6$ ohms during the reading operation.

34. A nonvolatile memory device according to claim 33, wherein each of said resistance elements has a resistance between $10^7$ to $10^{10}$ ohms during the reading operation.

35. A nonvolatile memory device according to claim 30, wherein each of said resistance elements has a resistance greater than $10^6$ ohms during the reading operation.

36. A nonvolatile memory device according to claim 35, wherein each of said resistance elements has a resistance between $10^7$ to $10^{10}$ ohms during the reading operation.

* * * * *